US012796415B2

(12) United States Patent
Sung et al.

(10) Patent No.: US 12,796,415 B2
(45) Date of Patent: Nov. 10, 2026

(54) LOWERING GATE ASPECT RATIO ON STI REGION

(71) Applicant: International Business Machines Corporation, Armonk, NY (US)

(72) Inventors: Min Gyu Sung, Latham, NY (US); Rishikesh Krishnan, Cohoes, NY (US); Nicolas Jean Loubet, Guilderland, NY (US); Julien Frougier, Albany, NY (US); Ruilong Xie, Niskayuna, NY (US); Tao Li, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 18/532,617

(22) Filed: Dec. 7, 2023

(65) Prior Publication Data

US 2025/0191966 A1 Jun. 12, 2025

(51) Int. Cl.
*H10W 10/00* (2026.01)
*H10D 84/83* (2025.01)
*H10W 10/17* (2026.01)

(52) U.S. Cl.
CPC .......... *H10W 10/014* (2026.01); *H10D 84/83* (2025.01); *H10D 84/834* (2025.01); *H10W 10/17* (2026.01)

(58) Field of Classification Search
CPC .. H10W 10/014; H10W 10/17; H10D 84/834; H10D 84/0158; H10D 84/0151
See application file for complete search history.

(56) References Cited

U.S. PATENT DOCUMENTS

| | | | | |
|---|---|---|---|---|
| 7,825,014 | B2 | 11/2010 | Sung et al. | |
| 8,021,969 | B2 | 9/2011 | Sung et al. | |
| 8,610,241 | B1 * | 12/2013 | Hu | H10D 8/00 257/353 |
| 8,674,413 | B1 * | 3/2014 | Chi | H10D 84/853 257/213 |
| 9,601,567 | B1 | 3/2017 | Hsieh | |
| 9,923,080 | B1 | 3/2018 | Greene et al. | |
| 10,008,496 | B1 | 6/2018 | Sato | |
| 10,374,066 | B2 * | 8/2019 | Seo | H10D 62/116 |
| 10,410,927 | B1 | 9/2019 | Cheng | |
| 10,510,870 | B2 | 12/2019 | Sung et al. | |
| 10,622,352 | B2 | 4/2020 | Greene et al. | |
| 10,680,107 | B2 | 6/2020 | Cheng | |
| 10,707,083 | B2 | 7/2020 | Cheng et al. | |
| 11,791,403 | B2 * | 10/2023 | Tsai | H10D 30/6211 257/288 |
| 2014/0231919 | A1 * | 8/2014 | Peng | H10D 84/834 257/368 |

(Continued)

*Primary Examiner* — Bac H Au
(74) *Attorney, Agent, or Firm* — Scully, Scott, Murphy & Presser, P.C.; Kimberly Zillig

(57) ABSTRACT

A semiconductor structure is provided that has a lowered gate aspect ratio on the shallow trench isolation area to prevent gate structure flop over. The structure includes a shallow trench isolation region including a first trench dielectric material having a first height. The structure further includes an active device region located adjacent to the shallow trench isolation region. The active device region includes a second trench dielectric material having a second height which is less than the first height.

19 Claims, 20 Drawing Sheets

(56) References Cited

U.S. PATENT DOCUMENTS

| | | | | |
|---|---|---|---|---|
| 2014/0246731 | A1* | 9/2014 | Chen | H10D 84/0151<br>257/386 |
| 2014/0315371 | A1* | 10/2014 | Cai | H10D 84/0193<br>438/424 |
| 2016/0005735 | A1* | 1/2016 | Costrini | H10D 64/017<br>438/283 |
| 2016/0276429 | A1* | 9/2016 | Tseng | H10D 64/017 |
| 2016/0363729 | A1* | 12/2016 | Baiocco | G02B 6/13 |
| 2017/0294356 | A1* | 10/2017 | Yeh | H10D 84/0151 |
| 2017/0358498 | A1 | 12/2017 | Cheng et al. | |
| 2018/0096992 | A1* | 4/2018 | Bi | H10D 84/83 |
| 2018/0144986 | A1* | 5/2018 | Zhang | H10D 84/0151 |
| 2019/0259859 | A1* | 8/2019 | Sung | H10D 30/024 |
| 2020/0105583 | A1* | 4/2020 | Wang | H10D 30/0243 |
| 2020/0105612 | A1* | 4/2020 | Lin | H10W 10/0145 |
| 2024/0047273 | A1* | 2/2024 | Chiang | H10D 84/0151 |

* cited by examiner

LOWERING GATE ASPECT RATIO ON STI REGION

BACKGROUND

The present application relates to semiconductor technology, and more particularly to a semiconductor structure including a lowered gate aspect ratio on the shallow trench isolation region to prevent gate structure flop over.

Over the last 30 years or so, the dimensions of semiconductor field effect transistors (FETS) have been steadily shrinking as scaling to smaller dimensions can lead to continuing device improvements. Planar FETs typically include a conducting gate electrode located over a semiconductor channel and electrically isolated from the channel by a gate dielectric layer. Current through the channel is controlled by applying voltage to the conducting gate. With conventional planar FET scaling reaching fundamental limits, the semiconductor industry is looking at more non-planar FET geometries that will facilitate continued device performance improvements. Examples of such non-planar FET geometries include FinFETs or nanosheet transistors.

SUMMARY

A semiconductor structure is provided that has a lowered gate aspect ratio on the shallow trench isolation region to prevent gate structure flop over. In one embodiment, the semiconductor structure includes a shallow trench isolation region including a first trench dielectric material having a first height. The structure further includes an active device region located adjacent to the shallow trench isolation region. The active device region includes a second trench dielectric material having a second height which is less than the first height.

BRIEF DESCRIPTION OF THE DRAWINGS

FIG. 1A includes cut X-X which is along a semiconductor fin (or semiconductor nanosheet stack) direction, and cut Y-Y with is along a gate direction which is perpendicular to the fin direction.

DETAILED DESCRIPTION

Figure 1A:
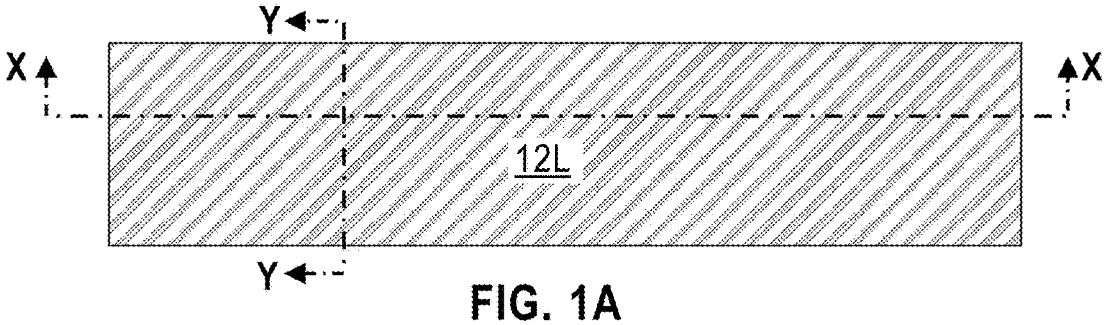
FIG. 1A a top down view of an exemplary semiconductor structure that can be employed in the present application, the exemplary semiconductor substrate including a hard mask layer located on a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

Due to a high aspect rate of a gate structure on a shallow trench isolation region, the gate structure is vulnerable to flop down after the gate etching process. Gate structure flop over is undesirable since it can cause a huge defectivity issue in downstream integration. A solution to this problem of gate structure flopping on the shallow trench isolation region is thus sought.

A semiconductor structure is provided that has a lowered gate aspect ratio on the shallow trench isolation region which in turn prevents gate structure flop over. In one embodiment (see, for example, FIGS. 13A-13B and 23A-23B), the semiconductor structure having this lowered gate aspect ratio includes a shallow trench isolation region, A, including a first trench dielectric material 18A having a first height, h1. The structure further includes an active device region located adjacent to the shallow trench isolation region, A. The active device region includes a second trench dielectric material 18B having a second height, h2, which is less than the first height, h1. Because the first height, h1, is greater than the second height, h2, a gate structure formed on the first trench dielectric has a smaller aspect ratio (gate height/gate width) than a gate structure formed on the second trench dielectric material 18B.

In embodiments of the present application (see, for example, FIGS. 13A-13B and 23A-23B), the shallow trench isolation region, A, further includes a first gate structure (e.g., one of the sacrificial gate structures 24 shown in the shallow trench isolation region, A), and the active device region includes a second gate structure (e.g., one of the sacrificial gate structures 24 that are present on semiconductor fin 10F or nanosheet stack 11/13).

In embodiments of the present application, the first gate structure has a smaller aspect ratio than the second gate structure.

In embodiments of the present application, the first gate structure is located entirely on the first trench dielectric material 18A, and the second gate structure is located on a surface of a semiconductor channel region (i.e., semiconductor fin 10F or nanosheet stack 11/13) and a surface of the second trench dielectric material 18B.

In embodiments, the semiconductor channel region is semiconductor fin 10F, and the first height, h1, of the first trench dielectric material 18A is located between a topmost surface and a bottommost surface of the semiconductor fin 10F. In such embodiments, the second height, h2, of the second trench dielectric material 18B is located between the topmost surface and the bottommost surface of the semiconductor fin 10F.

In some embodiments, the semiconductor channel region is a nanosheet stack 11/13, and the first height, h1, of the first trench dielectric material 18B is located between a topmost surface and a bottommost surface of the nanosheet stack 11/13. In such embodiments, the second height, h2, of the second trench dielectric material 18B is located beneath the bottommost surface of the nanosheet stack 11/13.

In some embodiments (see, for example, 23A-23B), the first trench dielectric material 18A has a middle portion of the first height, h1, and an end portion flanking each side of the middle portion having the second height, h2. In such embodiments, the semiconductor channel region is a nanosheet stack 11/13, and the first height, h1, of the first trench dielectric material 18A is located between a topmost surface and a bottommost surface of the nanosheet stack 11/13. In such embodiments, the second height, h2, of both the first trench dielectric material 18A and the second trench dielectric material 18B is located beneath a bottommost surface of the nanosheet stack 11/13. In such embodiments, the nanosheet stack 11/13 is located directly on a mesa portion 10M of a semiconductor substrate 10. In the present application, a mesa is a non-etched (i.e., raised) portion of a layer/structure.

In some embodiments, the semiconductor structure further includes a sacrificial semiconductor base layer 15 located beneath the nanosheet stack 11/13. In such embodiments, the second height, h2, of both the first trench dielectric material 18A and the second trench dielectric material 18B is located beneath a bottommost surface of the sacrificial semiconductor base layer 15. In such embodiments, the sacrificial semiconductor base layer 15 is located directly on mesa portion 10M of semiconductor substrate 10. The sacrificial base layer 15 can be replaced during nanosheet transistor formation with a bottom dielectric isolation layer.

In some embodiments of the present application, the first gate structure and the second gate structure are both sacrificial gate structures. In other embodiments, the first gate structure is an inactive functional gate structure and the second gate structure is a functional gate structure. In yet other embodiments, the first gate structure can be a sacrificial gate structure, while the second gate structure can be a functional gate structure.

In embodiments of the present application, the first trench dielectric material 18A and the second trench dielectric material 18B are composed of a compositionally same trench dielectric material. In embodiments of the present application, the semiconductor structure can further include dielectric liner 16L located along sidewalls of the first trench dielectric material 18A and along sidewalls of the second trench dielectric material 18B. In embodiments of the present application, the first trench dielectric material 18A is embedded in semiconductor substrate 10.

Figure 1B:
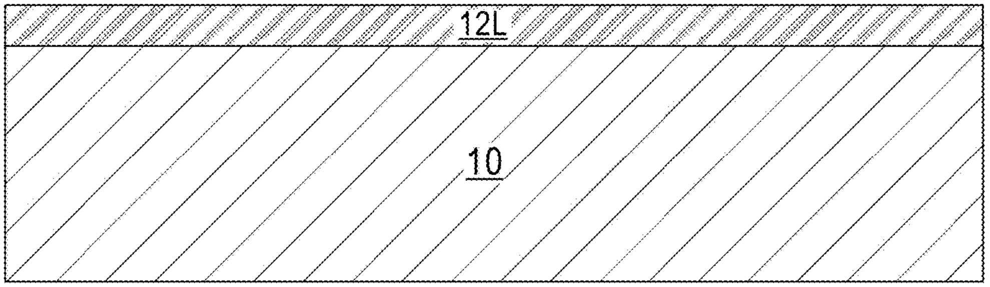
FIG. 1B is a cross sectional through X-X of the exemplary semiconductor structure shown in FIG. 1A.
Figure 1C:
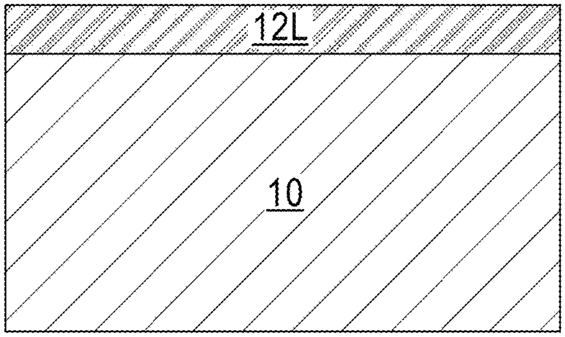
FIG. 1C is a cross sectional through Y-Y of the exemplary semiconductor structure shown in FIG. 1A.

These and other aspects of the present application will now be described in greater detail. Referring first to FIGS. 1A-1C, there are various views of an exemplary semiconductor structure that can be employed in the present application. The illustrated exemplary semiconductor structure includes a hard mask layer 12L located on a semiconductor substrate 10. The semiconductor substrate 10 is composed of at least one semiconductor material having semiconducting properties. In the present application, the at least one semiconductor material can be referred to as a first semiconductor material. Examples of first semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors. In some embodiments (not shown), the semiconductor substrate 10 can be composed of, from bottom to top, a first semiconductor layer, an etch stop layer, and a second semiconductor layer. The first semiconductor layer and the second semiconductor layer include one of the above mentioned first semiconductor materials. In embodiments, the semiconductor material that provides the first semiconductor layer can be compositionally the same as, or compositionally different from, the semiconductor material that provides the second semiconductor layer. In some embodiments, the etch stop layer can be composed of a dielectric material such as, for example, silicon dioxide and/or boron nitride. In other embodiments, the etch stop layer is composed of a semiconductor material that is compositionally different from the semiconductor material that provides the first semiconductor layer and the semiconductor material that provides the second semiconductor layer. In one example, the first semiconductor layer is composed of silicon, the etch stop layer is composed of silicon dioxide, and the second semiconductor layer is composed of silicon. In another example, the first semiconductor layer is composed of silicon, the etch stop layer is composed of silicon germanium, and the second semiconductor layer is composed of silicon.

In embodiments in which the semiconductor substrate 10 includes the first semiconductor layer, the etch stop layer and the second semiconductor layer can be formed utilizing techniques well known to those skilled in the art. For example, the substrate including the first semiconductor layer, the etch stop layer and the second semiconductor layer can be formed by a separation by ion implantation of oxygen process, or wafer bonding. Alternatively, the substrate including the first semiconductor layer, the etch stop layer and the second semiconductor layer can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The hard mask layer 12L is composed of any hard mask material including for example, silicon oxide, silicon nitride and/or silicon oxynitride. The hard mask layer 12L can be formed by a deposition process such as, for example, CVD, PECVD, physical vapor deposition (PVD) or atomic layer deposition (ALD). The hard mask layer 12L can have a thickness from 10 nm to 100 nm; although other thicknesses for the hard mask layer 12L are contemplated and can be used in the present application. In FIGS. 1A-1C (and FIG. 1D to follow), the hard mask layer 12L is a continuous layer that is formed over an entirety of the semiconductor substrate 10.

Figure 1D:
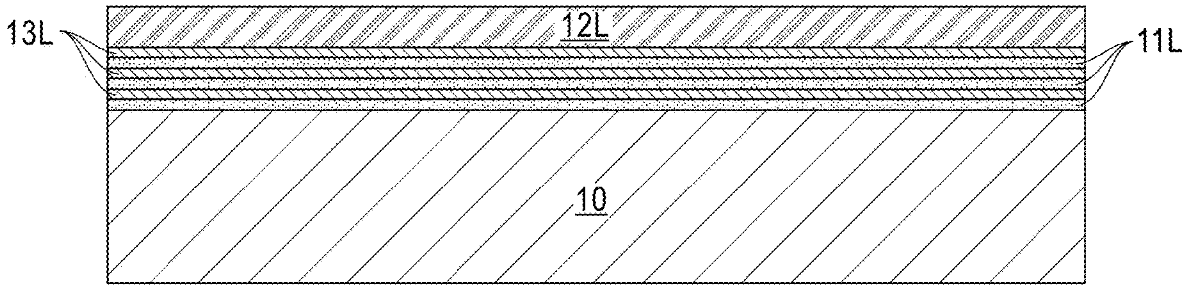
FIG. 1D is a cross sectional of another exemplary semiconductor structure that can be employed in the present application; this cross sectional view is through cut X-X shown in FIG. 1A.

Referring now to FIG. 1D, there is illustrated another exemplary semiconductor structure that can be employed in the present application; only the X-X cross section is shown.

The exemplary semiconductor structure illustrated in FIG. 1D includes semiconductor substrate 10, a material stack of alternating sacrificial semiconductor material layers 11L and semiconductor channel material layers 13L located on the semiconductor substrate 10, and hard mask layer 12L located on a topmost surface of the material stack. In this embodiment, the semiconductor substrate 10 and the hard mask layer 12L are as defined with respect to the exemplary semiconductor structure illustrated in FIGS. 1A-1C.

Each sacrificial semiconductor material layer 11L of the material stack is composed of a second semiconductor material and each semiconductor channel material layer 13L of the material stack is composed of a third semiconductor material. In the present application, the second semiconductor material is compositionally different from the third semiconductor material. The second semiconductor material and the third semiconductor material include one of the semiconductor materials mentioned above for the semiconductor substrate 10. In one example, the second semiconductor material that provides each sacrificial semiconductor material layer 11L is composed of a silicon germanium alloy having a germanium content from 20 atomic percent to 40 atomic percent, and the third semiconductor material that provides each semiconductor channel material layer 13L is composed of silicon. In some embodiments and as is illustrated in FIG. 1D, there is an equal number of sacrificial semiconductor material layers 11L and semiconductor channel material layers 13L in the material stack. That is, the material stack can include 'n' number of semiconductor channel material layers 13L and 'n' number of sacrificial semiconductor material layers 11L, wherein n is an integer starting from one; typically n is greater than one. By way of one example, the material stack includes three sacrificial semiconductor material layers 11L and three semiconductor channel material layers 13L. The material stack can be formed by one or more deposition processes including, for example, CVD, PECVD or epitaxial growth.

Figure 2A:
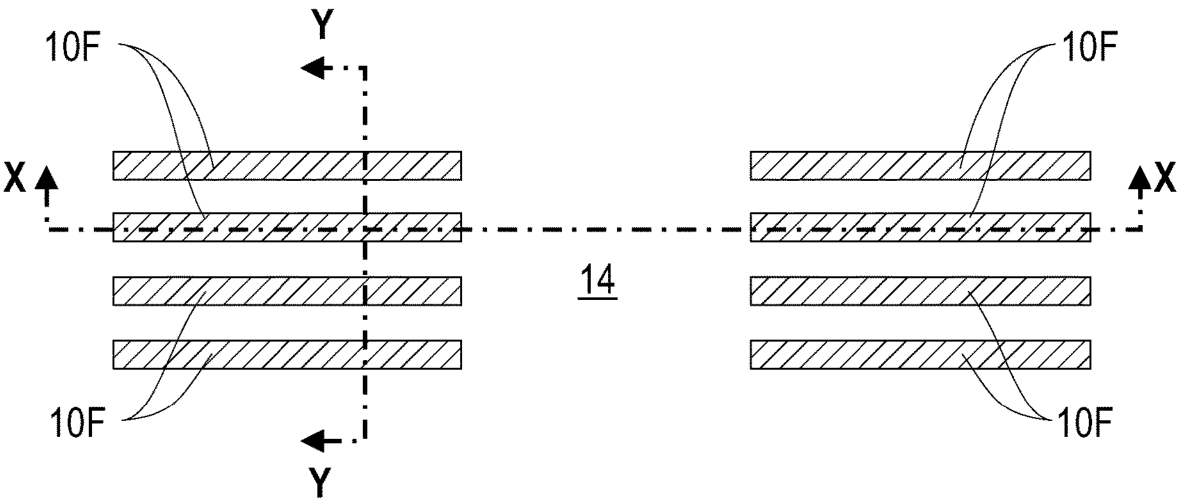
FIG. 2A a top down view of the exemplary semiconductor structure of FIG. 1A after semiconductor fin (or nanosheet stack) patterning; the remaining portions of the hard mask layer have been omitted from this top down view for clarity.
Figure 2B:
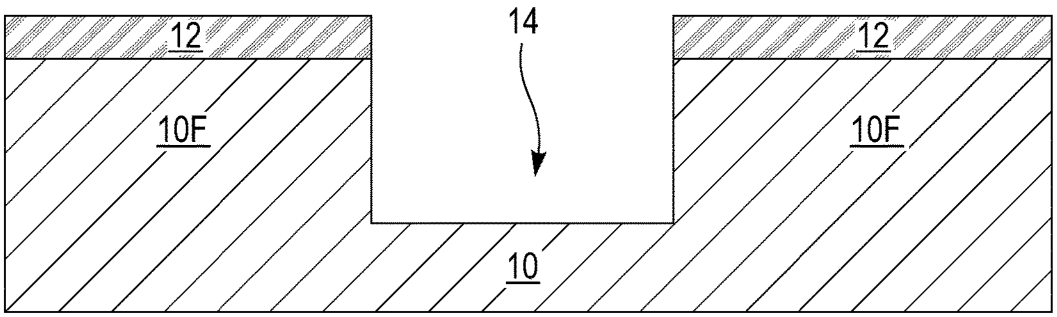
FIG. 2B is a cross sectional through X-X of the exemplary semiconductor structure shown in FIG. 2A.
Figure 2C:
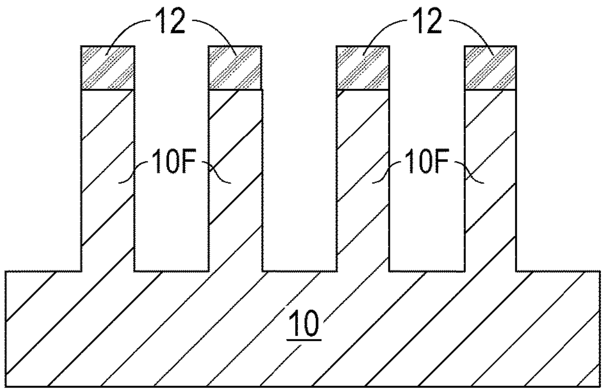
FIG. 2C is a cross sectional through Y-Y of the exemplary semiconductor structure shown in FIG. 2A.

Referring now to FIGS. 2A-2C, there are illustrated the exemplary semiconductor structure shown in FIG. 1A-1C, respectively, after semiconductor fin patterning. The semiconductor fin patterning includes lithography and etching. Lithography includes forming a photoresist material on a layer or stack of material layers that need to be patterned, exposing the photoresist material to a desired pattern of irradiation and thereafter developing the exposed photoresist material utilizing a conventional resist developer. The developed photoresist material has a desired pattern that is then transferred to the layer or stack of material layers that need to be patterned by etching. Etching can include dry etching and/or chemical wet etching. In one embodiment, a dry etch such as, for example, reactive ion etching (RIE), ion beam etching (IBE), plasma etching or any combination thereof can be used to transfer the pattern to the layer or stack of material layers that need to be patterned. The etch used in this patterning step etches entirely through the hard mask cap 12 and partially through the semiconductor substrate 10 such that a sub-surface of the semiconductor substrate 10 is physically exposed as shown in FIG. 2B. The term "sub-surface" is used in the present application to denote a surface of a material layer or structure that is located between a topmost surface and a bottommost surface of the material layer or structure.

Each remaining, i.e., unetched, portion of hard mask layer 12L is referred to herein as a hard mask cap 12. This semiconductor fin patterning process forms a plurality of semiconductor fins 10F that extend upward from a non-etched portion of the semiconductor substrate 10, and a trench 14 that separates one active device region (left hand side shown in FIGS. 2A-2B) from another active device region (right hand side shown in FIGS. 2A-2B). A hard mask cap 12 is present on top of each of the semiconductor fins 10F.

In some embodiments, each semiconductor fin 10F has a height, as measured from a base of the semiconductor fin 10F to a topmost surface of the semiconductor fin 10F of from 10 nm to 100 nm, and a width, as measured from one sidewall of the semiconductor fin 10F to an opposing sidewall of the semiconductor fin 10F of from 5 nm to 20 nm. The height and width ranges mentioned above are exemplary and other semiconductor fin heights and widths can be used in the present application.

It is noted that this fin patterning step can also be performed on the exemplary structure shown in FIG. 1D. In such a case (not shown in the present application, but readily apparent from FIGS. 14A-14B), this fin patterning step will provide nanosheet stacks of alternating patterned sacrificial semiconductor material layers and patterned semiconductor channel material layers located on unetched portions of the semiconductor substrate 10 that have fin-like characteristics. It is noted that remaining processing steps as shown in FIGS. 3A-13C can be performed on the structure including the nanosheets stacks that are located on the unetched portions of the semiconductor substrate 10.

In the present application, the semiconductor fin 10F and the nanosheet stacks (after removing each patterned sacrificial semiconductor material layer 11 from the nanosheet stacks) can function as a semiconductor channel region (or structure).

Figure 3A:
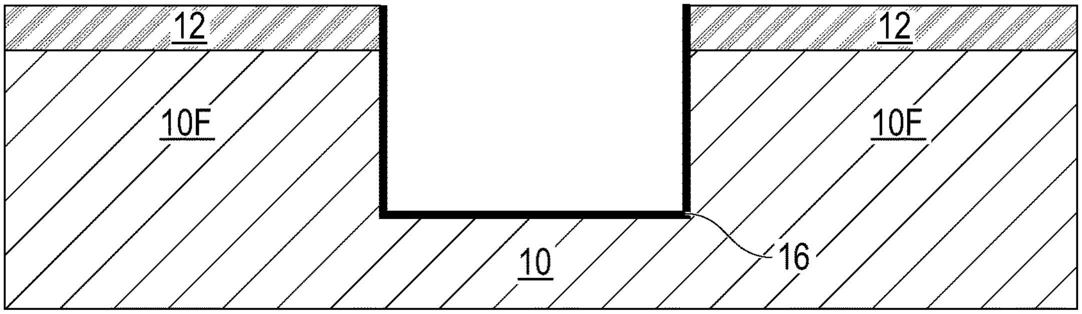
FIGS. 3A and 3B are cross sectional views of the exemplary semiconductor structure shown in FIGS. 2B and 2C, respectively, after forming a dielectric material layer.
Figure 3B:
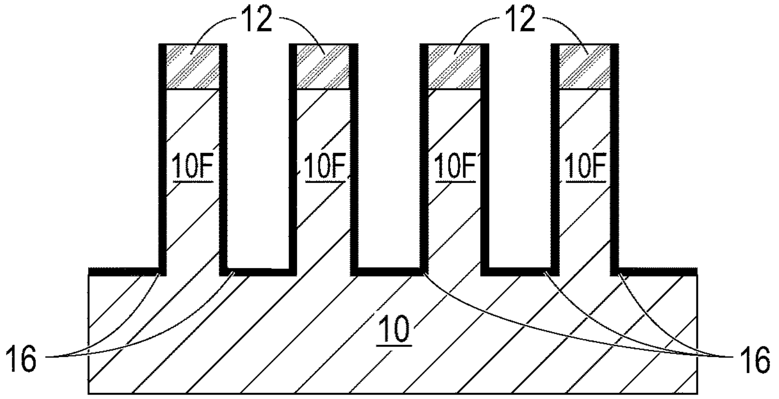

Referring now to FIGS. 3A and 3B, there is illustrated the exemplary semiconductor structure shown in FIGS. 2B and 2C, respectively, after forming a dielectric material layer 16. The dielectric material layer 16 is formed along the sidewalls and a bottom wall of the trench 14 and along the sidewalls of the semiconductor fins 10F and hard mask cap 12 that remains on top of each of the semiconductor fins 10F. The dielectric material layer 16 can also be formed on a topmost surface of each hard mask cap 12; this aspect of the present application is not shown in the cross sectional views FIG. 3A or 3B. The dielectric material layer 16 is also present along a physically exposed sub-surface of the semiconductor substrate 10 that is located between each of the semiconductor fins 10F that is along the gate direction of one of the active device regions (see, for example, FIG. 3B). The dielectric material layer 16 is composed of a dielectric material such as, for example, silicon oxide, silicon nitride and/or silicon oxynitride. The dielectric material that provides the dielectric material layer 16 can be compositionally the same as, or compositionally different from, the hard mask material that provides the hard mask cap 12. The dielectric material layer 16 can be formed by a deposition process including, for example, CVD, PECVD, or ALD. The dielectric material layer 16 is typically a conformal layer. The term 'conformal" denotes that a layer has a same thickness as measured from a horizontal surface of another layer or structure as a thickness as measured from a vertical surface of the another layer or structure. In some embodiments, a planarization process such as, for example, chemical mechanical polishing (CMP) can be used to remove the dielectric material layer 16 from atop each of the hard mask caps 12.

Figure 4A:
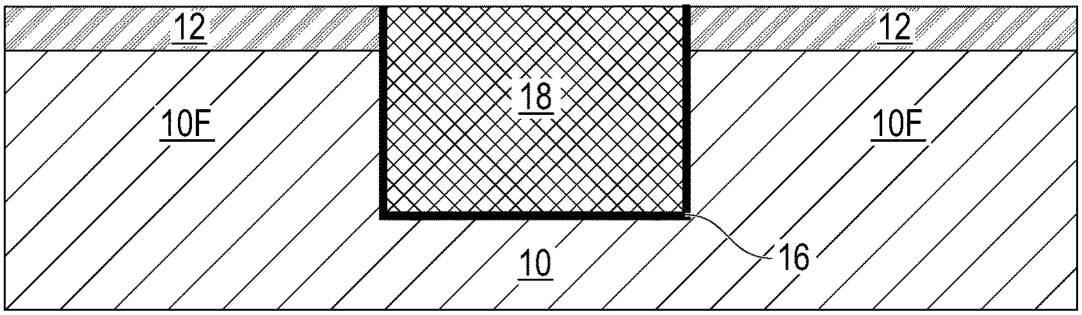
FIGS. 4A and 4B are cross sectional views of the exemplary semiconductor structure shown in FIGS. 3A and 3B, respectively, after forming a trench dielectric material.
Figure 4B:
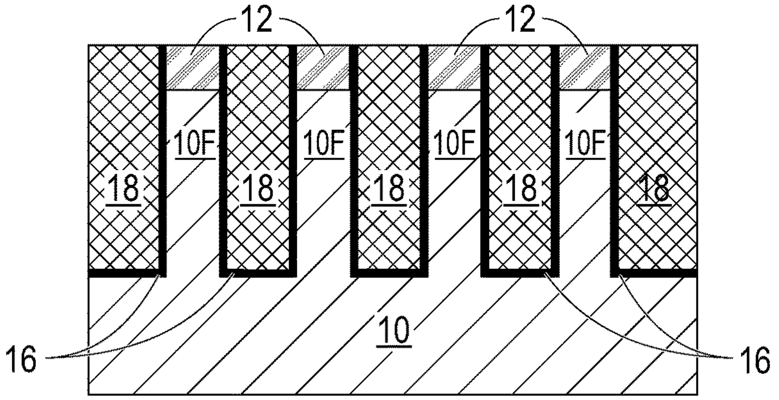

Referring now to FIGS. 4A and 4B, there are illustrated the exemplary semiconductor structure shown in FIGS. 3A and 3B, respectively, after forming a trench dielectric material 18. The trench dielectric material 18 can be composed of silicon dioxide or any other like dielectric material that is typically employed in forming a trench isolation structure. The trench dielectric material 18 can be formed by deposition, followed by a planarization process (such as, for example, CMP). The deposition process can include a flowable oxide CVD process or any other deposition process. The trench dielectric material 18 fills in the entirety of the trench 14 and is present between each of the semiconductor fins 10F along the gate direction shown in FIG. 4B. At this point of the present application, the trench dielectric material 18 that is present along the fin direction (see, FIG. 4A) has a same height as the trench dielectric material 18 that is present along the gate direction (see, FIG. 4B). Note that the planarization process used in forming the trench dielectric material 18 stops on a topmost surface of each hard mask cap 12. Thus, if the dielectric material layer 16 was not previously removed from atop each of the hard mask caps 12, the planarization process used in forming the trench dielectric material 18 would remove the dielectric material layer 16 from the topmost surface of each hard mask cap 12. Along the fin direction shown in FIG. 4A and along the gate direction shown in FIG. 4B, the trench dielectric material 18 has a topmost surface that is substantially coplanar with a topmost surface of each hard mask cap 12.

Figure 5A:
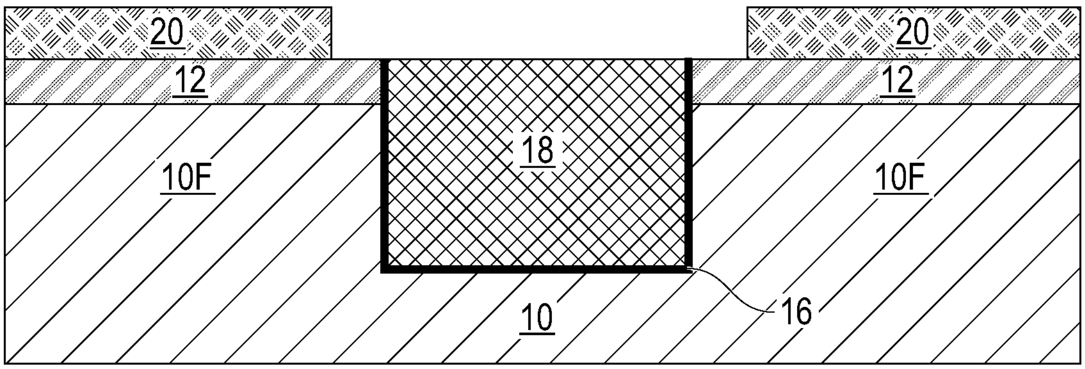
FIGS. 5A and 5B are cross sectional views of the exemplary semiconductor structure shown in FIGS. 4A and 4B, respectively, after forming a patterned organic planarization layer (OPL), wherein the patterned OPL includes an opening that physically exposes the trench dielectric material that is present along the fin direction.
Figure 5B:
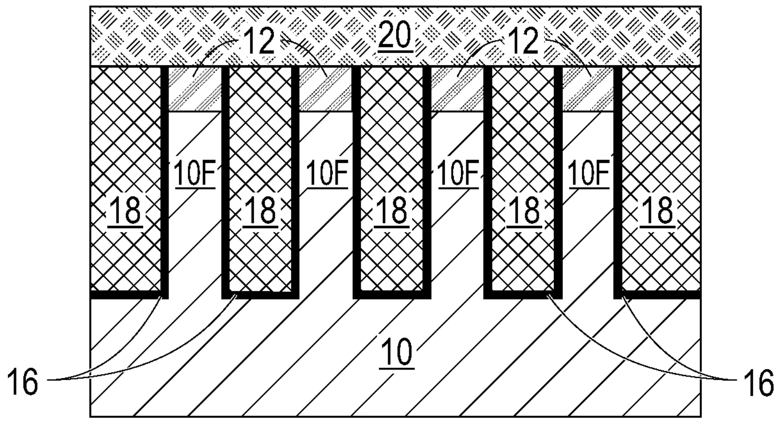

Referring now to FIGS. 5A and 5B, there are illustrated the exemplary semiconductor structure shown in FIGS. 4A and 4B, respectively, after forming a patterned organic planarization layer (OPL) 20, wherein the patterned OPL 20 includes an opening (see, FIG. 5A) that physically exposes the trench dielectric material 18 that is present along the fin direction. As is shown in FIG. 5A, the patterned OPL 20 of this embodiment is not present on top of the entirety of the hard mask caps 12 that are present along the fin direction. As is shown in FIG. 5B, the patterned OPL 20 does cover the trench dielectric material 18, and each hard mask cap 12 that is along the gate direction. The patterned OPL 20 can be formed by deposition (e.g., CVD, PECVD, or spin-on coating), lithography and etching. The patterned OPL 20 is composed of any conventional OPL material.

Figure 6A:
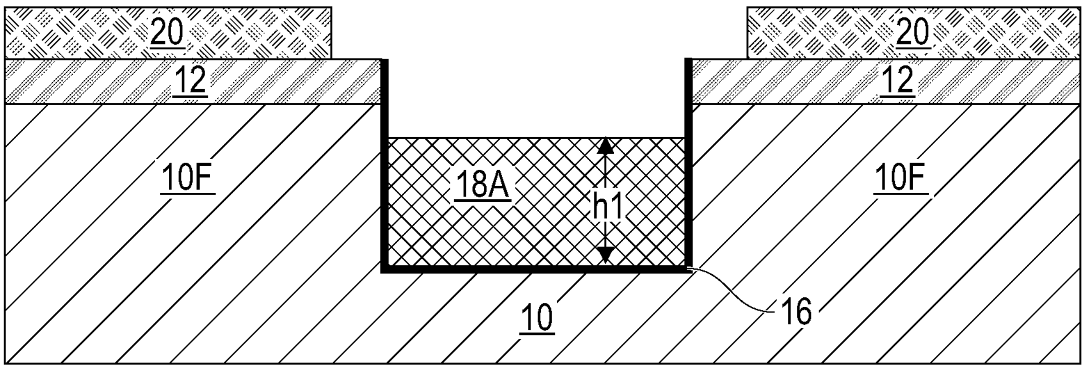
FIGS. 6A and 6B are cross sectional views of the exemplary semiconductor structure shown in FIGS. 5A and 5B, respectively, after recessing the physically exposed trench dielectric material that is present along the fin direction.
Figure 6B:
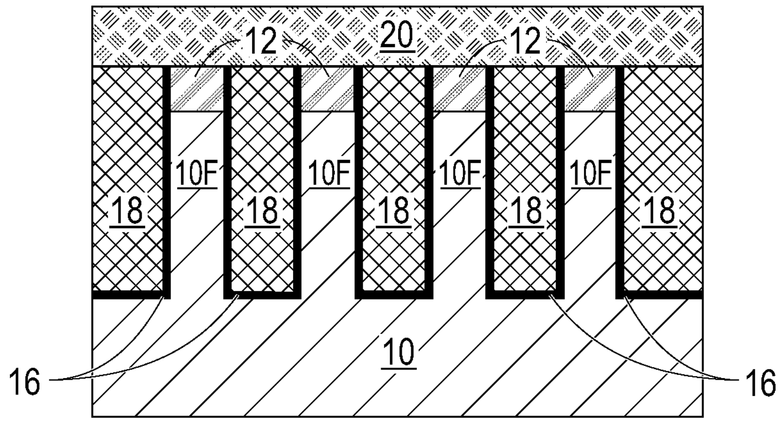

Referring now to FIGS. 6A and 6B, there are illustrated the exemplary semiconductor structure shown in FIGS. 5A and 5B, respectively, after recessing the physically exposed trench dielectric material 18 that is present along the fin direction. This recessing provides a first trench dielectric material 18A along the fin direction that has a first height, h1. This first height h1 of the first dielectric material 18A is less than the original height, h0, of the as-deposited trench dielectric material 18 (see, for example, FIG. 6B). In this embodiment, the first height, h1, is located between a bottommost and topmost surface of the semiconductor fin 10F (or nanosheet stack when the structure shown in FIG. 1D is employed). The recess utilizes the patterned OPL 20 as an etch mask and the recessing includes a partial etching process that is selective in removing dielectric material that provides the trench dielectric material 18.

Figure 7A:
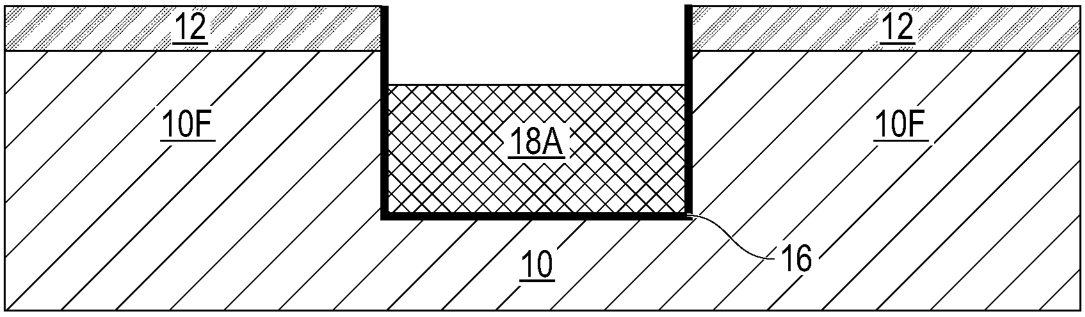
FIGS. 7A and 7B are cross sectional views of the exemplary semiconductor structure shown in FIGS. 6A and 6B, respectively, after removing the patterned OPL from the entirety of the structure.
Figure 7B:
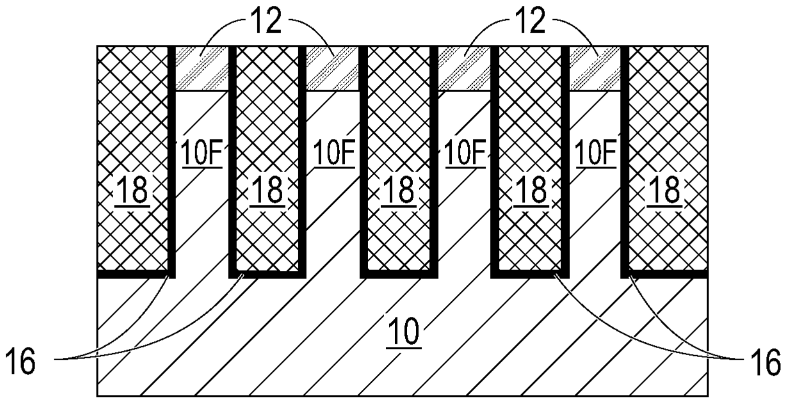

Referring now to FIGS. 7A and 7B, there are illustrated the exemplary semiconductor structure shown in FIGS. 6A and 6B, respectively, after removing the patterned OPL 20 from the entirety of the structure. The patterned OPL 20 can be removed utilizing a material removal process such as, for example, ashing, that is selective in removing the patterned OPL 20.

Figure 8A:
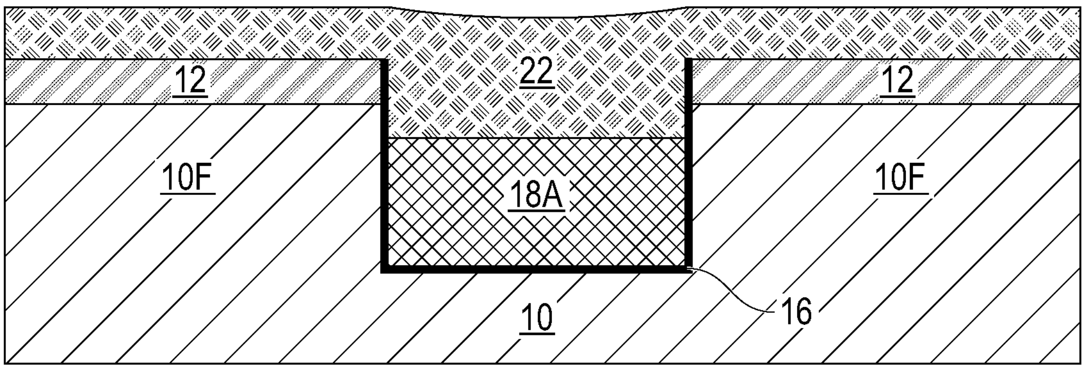
FIGS. 8A and 8B are cross sectional views of the exemplary semiconductor structure shown in FIGS. 7A and 7B, respectively, after forming a masking layer.
Figure 8B:
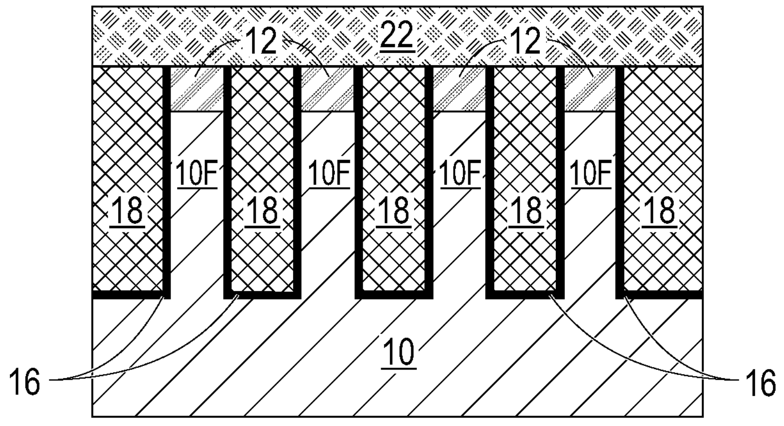

Referring now to FIGS. 8A and 8B, there are illustrated the exemplary semiconductor structure shown in FIGS. 7A and 7B, respectively, after forming a masking layer 22. The masking layer 22 including any masking material such as an OPL material. The masking layer 22 can be formed utilizing a deposition process such as, for example, CVD, PECVD or spin-on coating.

Figure 9A:
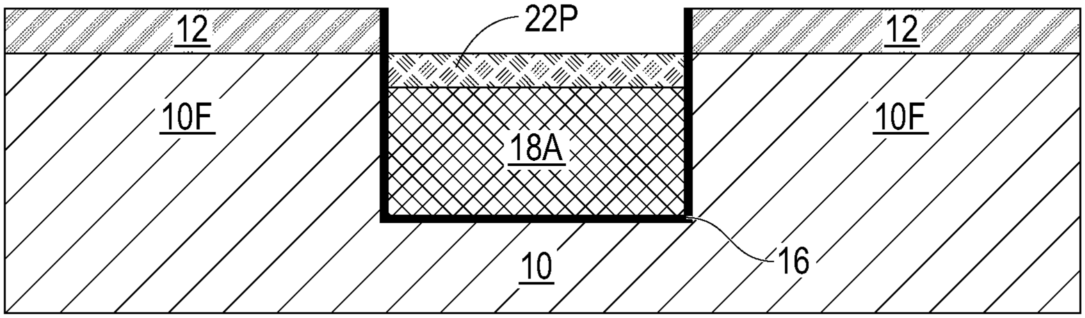
FIGS. 9A and 9B are cross sectional views of the exemplary semiconductor structure shown in FIGS. 8A and 8B, respectively, after removing the masking layer that is present on the hard mask cap, while maintaining the masking layer as a block mask on the recessed trench dielectric material that is present along the fin direction.
Figure 9B:
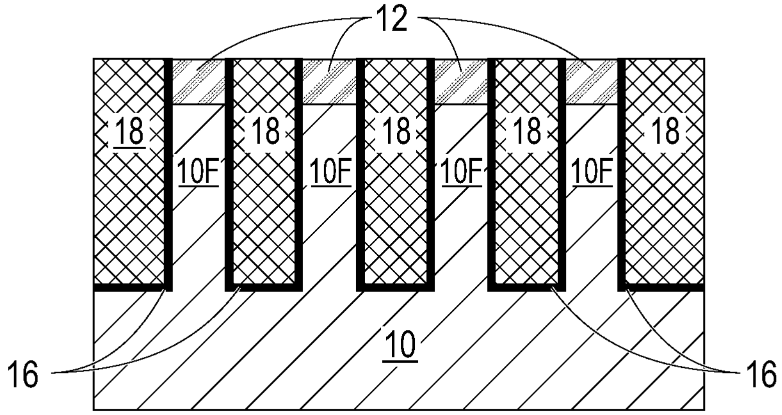

Referring now to FIGS. 9A and 9B, there are illustrated the exemplary semiconductor structure shown in FIGS. 8A and 8B, respectively, after removing the masking layer 22 that is present on the hard mask cap 12, while maintaining the masking layer 22 as a block mask 22P on the recessed trench dielectric material (i.e., first trench dielectric material 18A) that is present along the fin direction. This removal step includes a recess etch that is selective in removing the masking layer 22 from atop the hard mask caps 12. The recess etch does not remove the entirety of the masking layer 22 from within the trench 14. Instead, a portion of the masking layer 22 remains in the trench 14 and this remaining portion, i.e., block mask 22P, protects the first dielectric material 18A having the first height, h1, from a subsequently performed recess of the trench dielectric material 18 along the gate direction.

Figure 10A:
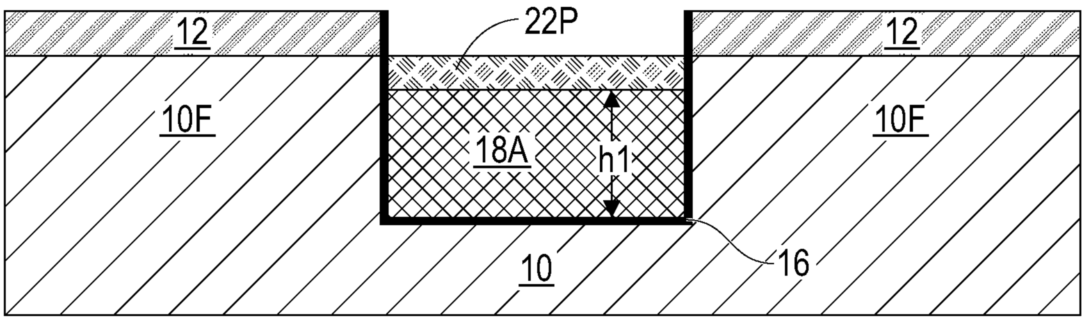
FIGS. 10A and 10B are cross sectional views of the exemplary semiconductor structure shown in FIGS. 9A and 9B, respectively, after recessing the physically exposed trench dielectric material that is present along the gate direction.
Figure 10B:
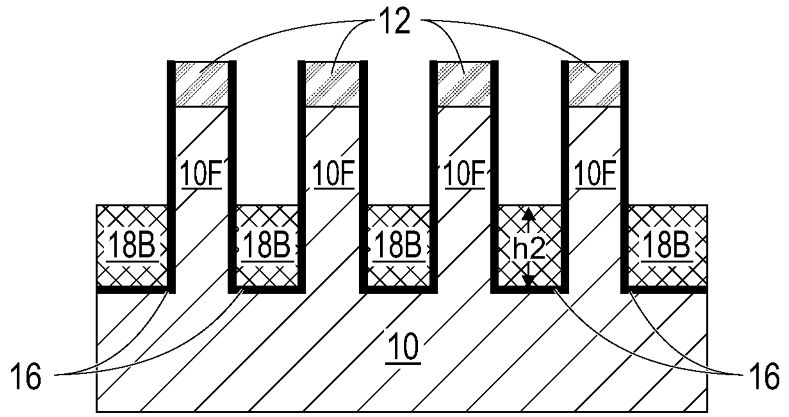

Referring now to FIGS. 10A and 10B, there are illustrated the exemplary semiconductor structure shown in FIGS. 9A and 9B, respectively, after recessing the physically exposed trench dielectric material 18 that is present along the gate direction. This recessing provides a second trench dielectric material 18B along the gate direction that has a second height, h2. This second height h2 of the second dielectric material 18B is less than the first height, h1, of the first trench dielectric material 18A. The second height, h2, is between a bottommost and a topmost surface of the semiconductor fin 10F (in embodiments in which a nanosheet stack is employed, the second height, h2, is beneath the bottommost surface of the nanosheet stack). The recessing includes a partial etching process that is selective in removing dielectric material that provides the trench dielectric material 18. In the present application, the first trench dielectric material 18A that is along the fin direction and in the trench 14 can be referred to as a first trench dielectric structure that separates two active device regions from each other, while the second trench dielectric material 18B that is along the gate direction can be referred to as a second trench dielectric structure that is located along the base of each semiconductor fin 10F (or unetched portion of the semiconductor substrate 10 in cases in which a nanosheet stack is formed).

Figure 11A:
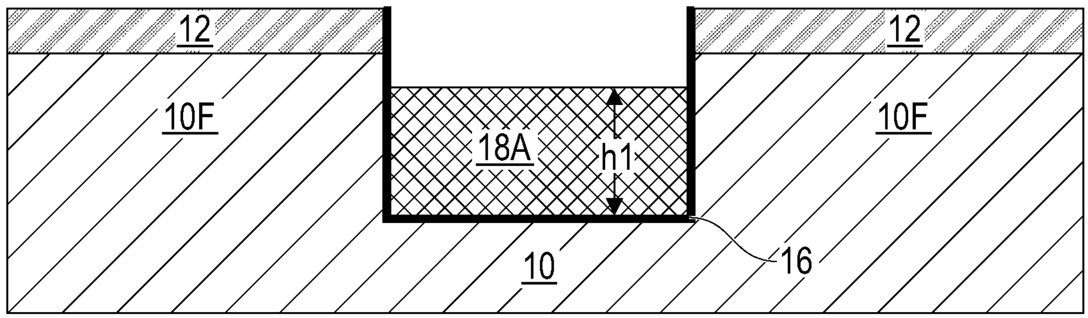
FIGS. 11A and 11B are cross sectional views of the exemplary semiconductor structure shown in FIGS. 10A and 10B, respectively, after removing the block mask that was maintained on the recessed trench dielectric material that is present along the fin direction.
Figure 11B:
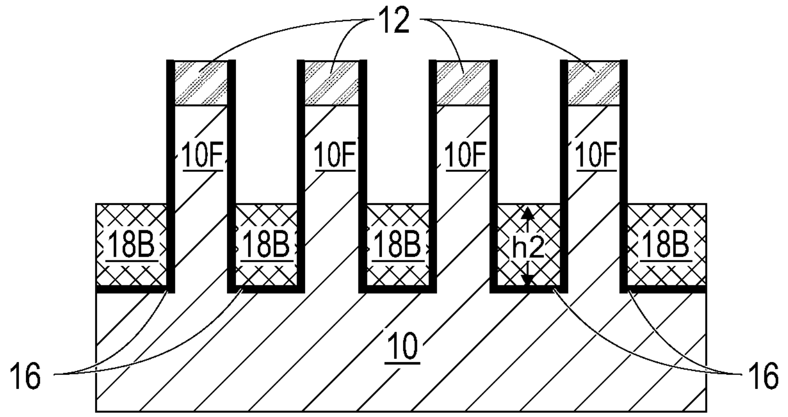

Referring now to FIGS. 11A and 11B, there are illustrated the exemplary semiconductor structure shown in FIGS. 10A and 10B, respectively, after removing the block mask 22P that was maintained on the recessed trench dielectric material (i.e., the first trench dielectric material 18A) that is present along the fin direction. The block mask 22P can be removed utilizing any material removal process that is selective in removing the material that provides the block mask 22P.

Figure 12A:
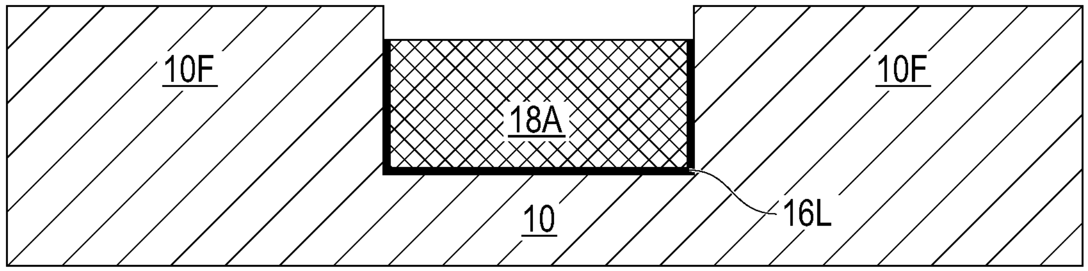
FIGS. 12A and 12B are cross sectional views of the exemplary semiconductor structure shown in FIGS. 11A and 11B, respectively, after removing each hard mask cap.
Figure 12B:
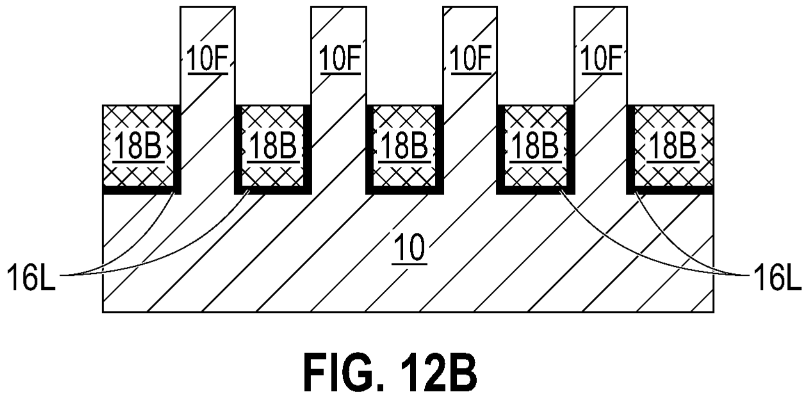

Referring now to FIGS. 12A and 12B, there are illustrated the exemplary semiconductor structure shown in FIGS. 11A and 11B, respectively, after removing each hard mask cap 12. During the removal of the hard mask caps 12 an upper portion of the dielectric material layer 16 that is not covered by either the first trench dielectric material 18A and the second trench dielectric material 18B can removed. The remaining dielectric material layer 16 can be referred to herein as dielectric liner 16L. Note that an upper portion of each of the semiconductor fins 10F will now be physically exposed as is shown in FIGS. 12A and 12B. The removal of each hard mask cap 12 and the partial removal of the dielectric material layer 16 includes one or more etching process. In one example and when the hard mask caps 12 and the dielectric material layer 16 are composed of a compositionally same dielectric material, a single RIE process can be used to remove each hard mask cap 12 and the partial removal of the dielectric material layer 16. In another example and when the hard mask caps 12 and the dielectric material layer 16 are composed of compositionally different dielectric materials, two separate RIE processes can be used to remove each hard mask cap 12 and to partially remove the dielectric material layer 16.

Figure 13A:
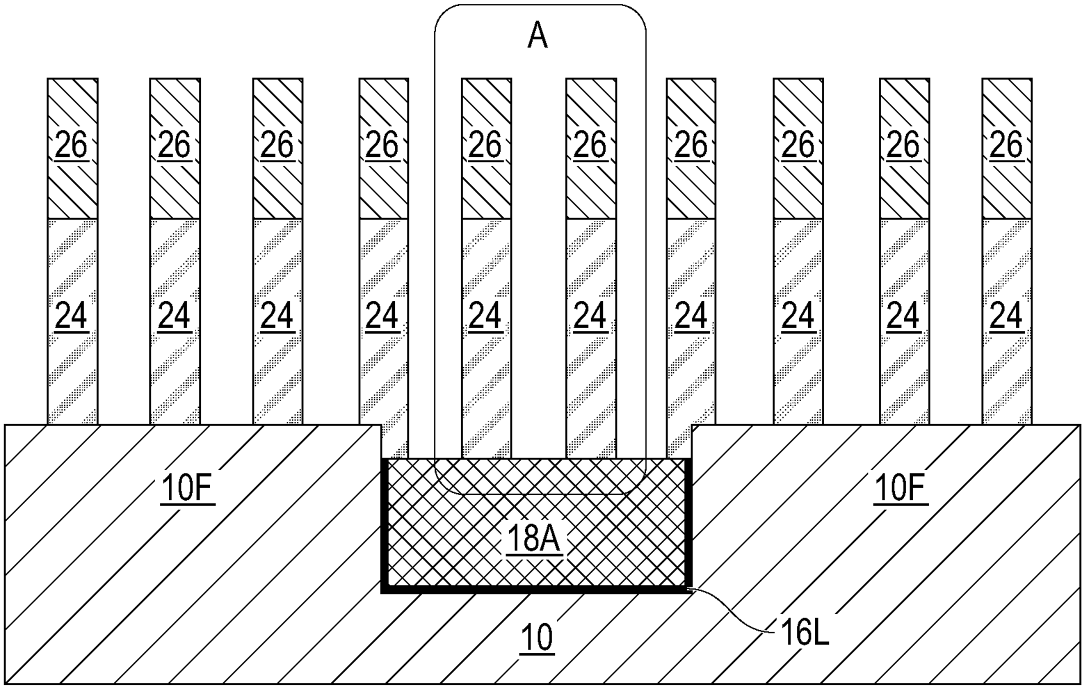
FIGS. 13A and 13B are cross sectional views of the exemplary semiconductor structure shown in FIGS. 12A and 12B, respectively, after forming sacrificial gate structures.
Figure 13B:
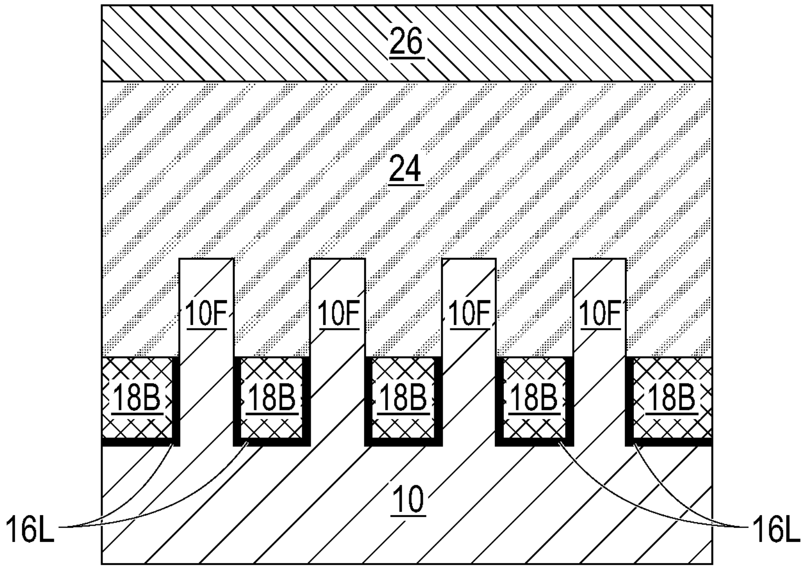
Figure 13C:
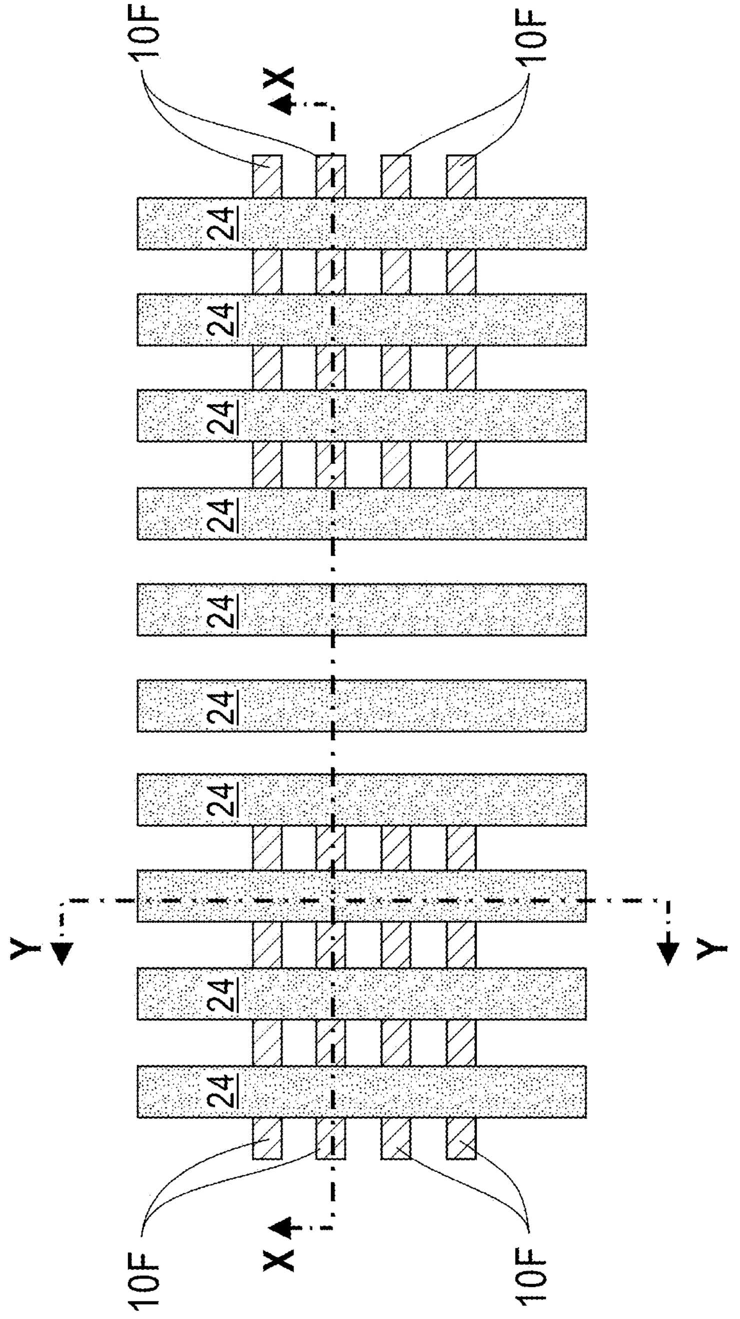
FIG. 13C is a top down view of the exemplary structure shown in FIGS. 13A-13B; some of the elements/components present in FIGS. 13A-13B are omitted from the top down view for clarity.

Referring now to FIGS. 13A and 13B, there are illustrated the exemplary semiconductor structure shown in FIGS. 12A and 12B, respectively, after forming sacrificial gate structures 24. A top down view of the structure shown in FIGS. 13A and 13B is shown in FIG. 13C. In embodiments, a sacrificial gate cap 26 can be formed on top of each sacrificial gate structure 24. Some of the sacrificial gate structures 24 staddle the semiconductor fins 10F, i.e., the sacrificial gate structure 24 are located along physically exposed sidewalls of the semiconductor fin 10F and are present on a topmost surface of the semiconductor fins 10F; this sacrificial gate structure 24 also contacts the second trench dielectric material 18B as is shown in FIG. 13B. Other sacrificial gate structures 24 are formed directly on the first trench dielectric material 18A and in shallow trench isolation region A. Yet other sacrificial gate structures 24 are partially formed on a semiconductor fin 10F and partially formed on the first trench dielectric material 18A.

Each sacrificial gate structure 24 includes at least a sacrificial gate material. In some embodiments, each sacrificial gate structure 24 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. Each sacrificial gate cap 26 is composed of a hard mask material such as, for example, silicon nitride or silicon oxynitride. In the present application, each sacrificial gate structure 24 containing the sacrificial gate cap 26 can be formed depositing a blanket layer of optional sacrificial gate dielectric material (if the same is present), a blanket layer of the sacrificial gate material, and a blanket layer of the hard mask material (if the sacrificial gate cap 26 is present). Deposition can include, for example, CVD, PECVD, or physical vapor deposition (PVD). These blanket deposition layers are then patterned by lithography and etching to provide sacrificial gate structure 24 that are optionally capped with sacrificial gate cap 26.

As is shown in FIG. 13A, the sacrificial gate structures 24 that are located entirely in shallow trench isolation region, A, and formed directly on the first trench dielectric material 18A have a smaller aspect ratio compared to the sacrificial gate structures 24 that are located in the two active device regions and which straddle the semiconductor fins 10F; all gate structures formed in the shallow trench isolation region A and on the first trench dielectric material 18A having h1 have a substantially same aspect ratio. Those sacrificial gate structures 24 that are located partially on the semiconductor fin 10F and partially on the first trench dielectric material 18A have a smaller aspect ratio compared to sacrificial gate structures 24 formed only in the active device region. In the present application, the aspect ratio is a ratio of the height to width of each gate structures. The gate structures can be the sacrificial gate structures 24 as mentioned above or functional gate structures that are subsequently formed during a replacement gate process in which the sacrificial gate structures 24 are removed and replaced with a functional gate structure. The functional gate structures that are formed entirely in the active device region are active functional gate structures, while the functional gate structures located entirely in the shallow trench isolation region are inactive functional gate structures. For the functional gate structures, the functional gate structures that are located in shallow trench isolation region A and located on the first trench dielectric material 18A have a smaller aspect ratio as compared to the functional gate structures that are located in the two active device regions and which straddle the semiconductor fins 10F. In some embodiments, only the sacrificial gate structures 24 that are present in the active device region are replaced with a functional gate structure. No gate structure flop over is observed in the shallow trench isolation region, A.

Each functional gate structure that can subsequently replace the sacrificial gate structures 24 includes a gate dielectric layer and a gate electrode. The gate dielectric layer is composed of a gate dielectric material that has a dielectric constant of greater than 4.0; all dielectric constants mentioned are measured in a vacuum unless otherwise stated. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)$O_3$), and/or lead zinc niobite (Pb(Zn,Nb)O). The gate dielectric material can further include dopants such as lanthanum (La), aluminum (Al) and/or magnesium (Mg).

The gate electrode is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The functional gate structure can be formed by deposition of the gate dielectric material and the gate electrode material, followed by a planarization process.

Figure 14:
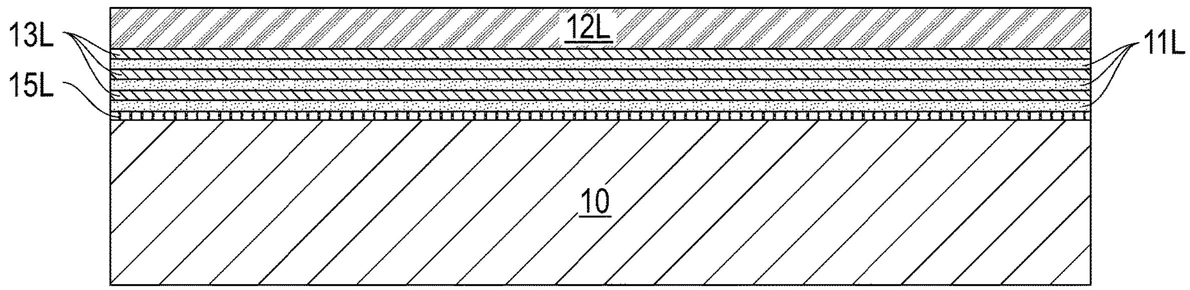
FIG. 14 is a cross sectional of a further exemplary semiconductor structure that can be employed in the present application; this cross sectional view is through cut X-X shown in FIG. 1A.

Referring now to FIG. 14, there is illustrated a further exemplary semiconductor structure that can be employed in the present application. The exemplary semiconductor structure includes semiconductor substrate 10, as defined above, a sacrificial semiconductor base layer 15L, a material stack of alternating sacrificial semiconductor material layers 11L and semiconductor channel material layers 13L, as defined above, and a hard mask layer 12L, as defined above.

The sacrificial semiconductor base layer 15L is composed of a fourth semiconductor material that is compositionally different from an upper surface of the semiconductor substrate 10, the second semiconductor material that provides each sacrificial semiconductor material layer 11L, and the third semiconductor material that provides each semiconductor channel material layer 13L. In one example, the fourth semiconductor material that provides the sacrificial semiconductor base layer 15L is composed of a silicon germanium alloy having a germanium content from 55 atomic percent to 75 atomic percent, the second semiconductor material that provides each sacrificial semiconductor material layer 11L is composed of a silicon germanium alloy having a germanium content from 20 atomic percent to 40 atomic percent, and the third semiconductor material that provides each semiconductor channel material layer 13L is composed of silicon. The sacrificial semiconductor base layer 15L and the material stack can be formed by one or more deposition processes including, for example, CVD, PECVD or epitaxial growth.

Figure 15A:
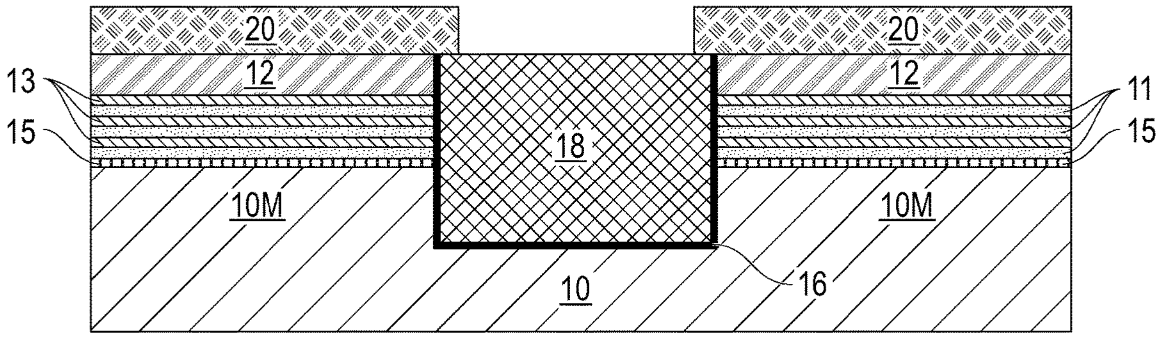
FIG. 15A is a cross sectional view of the exemplary structure shown in FIG. 14 after semiconductor fin patterning, and forming a dielectric material layer, a trench dielectric material, and a patterned organic planarization layer (OPL), wherein the patterned OPL includes an opening that physically exposes the trench dielectric material that is present along the fin direction.
Figure 15B:
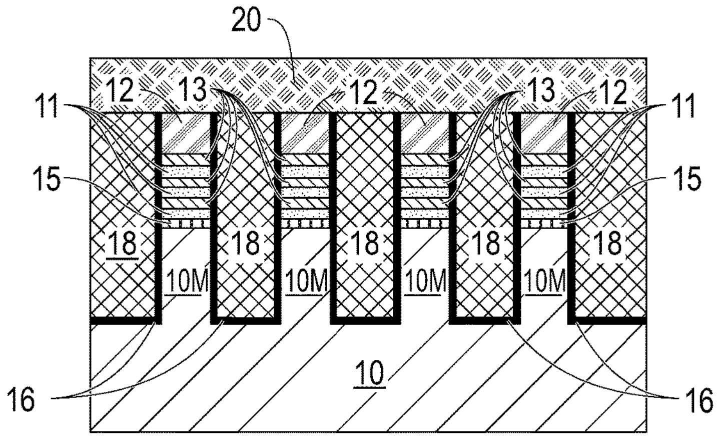
FIG. 15B is a cross sectional view of the exemplary structure shown in FIG. 15A and along cut Y-Y as shown in FIG. 1A.

Referring now to FIGS. 15A-15C, there is illustrated the exemplary structure shown in FIG. 14 after semiconductor fin patterning, and forming a dielectric material layer 16, a trench dielectric material 18, and a patterned OPL 20, wherein the patterned OPL 20 includes an opening that physically exposes the trench dielectric material 18 that is present along the fin direction.

The semiconductor fin patterning performed in this embodiment of the present application includes lithography and etching as defined above in the semiconductor fin patterning step illustrated in FIGS. 2A-2C. In this embodiment, the unetched portions of the semiconductor substrate 10 can be referred to as a semiconductor mesa 10M (the semiconductor mesa 10M are fin-like structures). Also, this fin patterning step patterns the sacrificial semiconductor base layer 15L, the material stack of alternating sacrificial semiconductor material layers 11L and semiconductor channel material layers 13L, and the hard mask layer 12L. Each remaining, i.e., non-etched, portion of the sacrificial semiconductor base layer 15L can be referred to as a patterned sacrificial semiconductor base layer 15. Each patterned sacrificial semiconductor base layer 15 sits directly on one of the underlying semiconductor mesas 10M of the semiconductor substrate 10. Each remaining, i.e., non-etched, portion of the material stack can be referred to as a nanosheet stack. Each nanosheet stack sits directly on one of the underlying patterned sacrificial semiconductor base layers 15. Each remaining, i.e., non-etched, portion of the sacrificial semiconductor material layers 11L can be referred to as a patterned sacrificial semiconductor material layer 11, and each remaining, i.e., non-etched, portion of semiconductor channel material layer 13L can be referred to as a patterned semiconductor channel material layer 13. In the present application, each nanosheet stack that is formed during semiconductor fin patterning including alternating patterned sacrificial semiconductor material layers 11 and patterned semiconductor channel material layers 13. This semiconductor fin patterning step also forms a trench, as defined above, in FIG. 2B.

The dielectric material layer 16 of this embodiment of the present application includes a dielectric material as mentioned above for forming the same layer in FIGS. 3A-3B. The dielectric material layer 16 of this embodiment can be formed utilizing the same technique as mentioned above in forming the same layer in FIGS. 3A-3B.

The trench dielectric material 18 of this embodiment of the present application includes a trench dielectric material as mentioned above for forming the same material in FIGS. 4A-4B. The trench dielectric material 18 of this embodiment can be formed utilizing the same technique as mentioned above in forming the same material in FIGS. 4A-4B.

The patterned OPL 20 of this embodiment of the present application includes a OPL material as mentioned above for forming the same layer in FIGS. 5A-5B. The patterned OPL 20 of this embodiment can be formed utilizing the same technique as mentioned above in forming the same layer in FIGS. 5A-5B. The patterned OPL 20 of this embodiment differs from the patterned OPL 20 shown in FIGS. 5A-5B in that in the fin direction the patterned OPL 20 of this embodiment extends onto a surface of the trench dielectric material, as is shown in FIG. 15A.

Figure 16A:
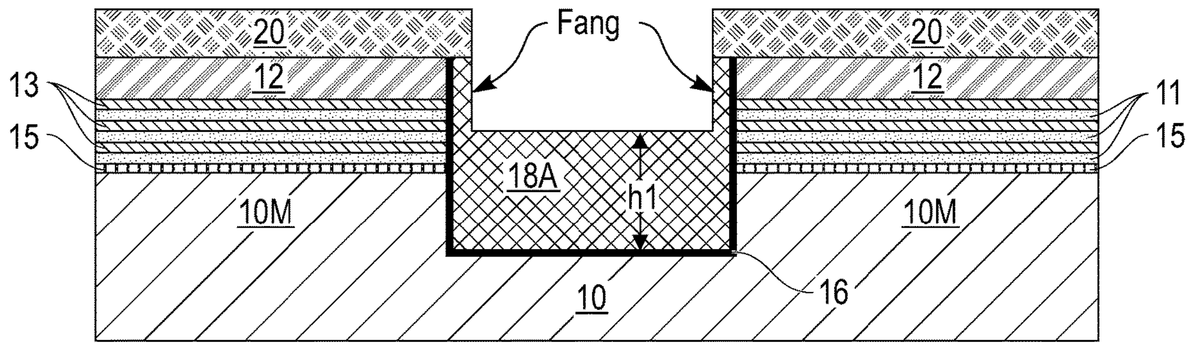
FIGS. 16A and 16B are cross sectional views of the exemplary structure shown in FIGS. 15A and 15B, respectively, after recessing the physically exposed trench dielectric material that is present along the fin direction.
Figure 16B:
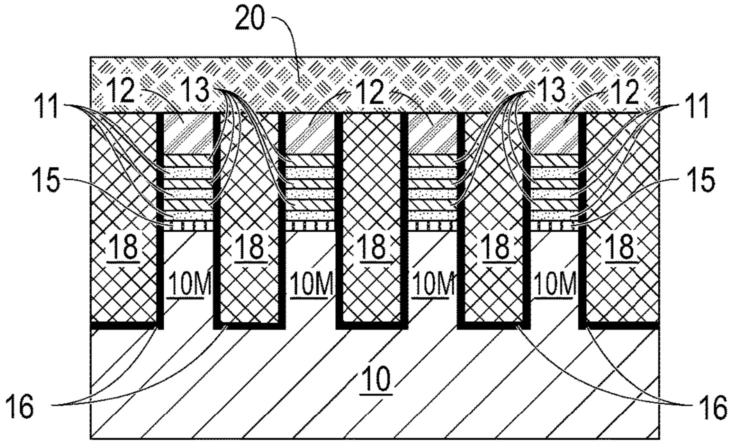

Referring now to FIGS. 16A and 16B, there are illustrated the exemplary structure shown in FIGS. 15A and 15B, respectively, after recessing the physically exposed trench dielectric material 18 that is present along the fin direction. No recessing of the trench dielectric material 18 in the gate direction occurs since the patterned OPL 20 prevents trench dielectric material etching in that region of the structure. This recess step utilizes the patterned OPL 20 as an etch mask and the recessing includes a partial etching process that is selective in removing dielectric material that provides the trench dielectric material 18. This recessing provides a first trench dielectric material 18A along the fin direction that has a first height, h1. This first height h1 of the first dielectric material 18A is less than the original height, h0, of the as-deposited trench dielectric material 18 (see, for example, FIG. 16B). In this embodiment, the first height, h1, is also between the topmost and bottommost surface of the nanosheet stack. A trench dielectric material fang (labeled as fang in FIG. 16A) remains along the sidewalls of hard mask cap 12, the nanosheet stack and the patterned semiconductor base layer 15. This fang is present directly beneath the portion of the patterned OPL layer 20 that extends onto the as-deposited trench dielectric material 18. Each fang has a same height, i.e., h0, as the as deposited trench dielectric material 18.

Figure 17A:
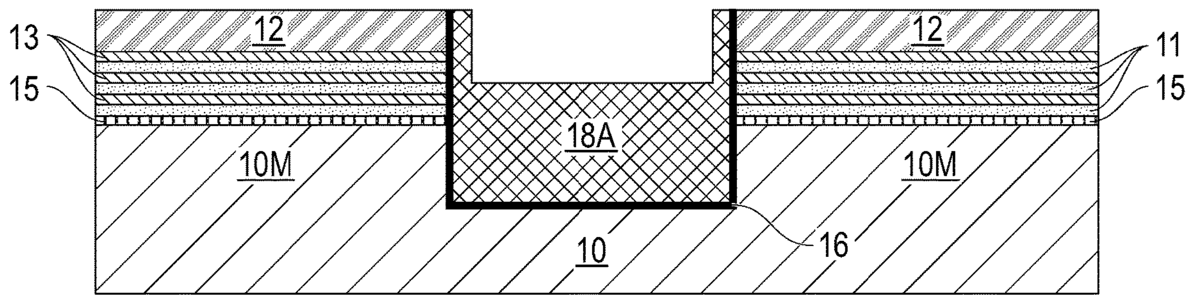
FIGS. 17A and 17B are cross sectional views of the exemplary semiconductor structure shown in FIGS. 16A and 16B, respectively, after removing the patterned OPL from the entirety of the structure.
Figure 17B:
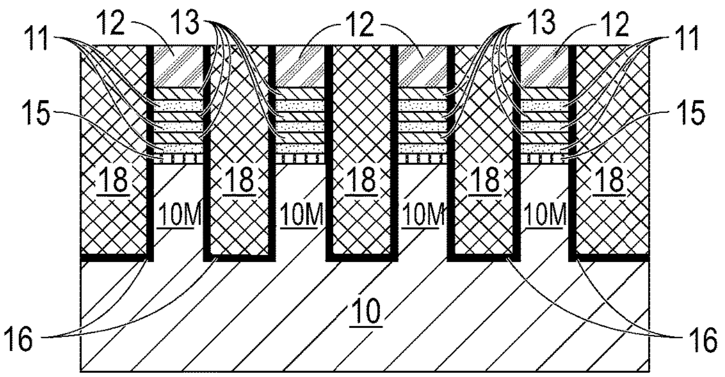

Referring now to FIGS. 17A and 17B, there are illustrated the exemplary semiconductor structure shown in FIGS. 16A and 16B, respectively, after removing the patterned OPL 20 from the entirety of the structure. The patterned OPL 20 can be removed utilizing a material removal process such as, for example, ashing, that is selective in removing the patterned OPL 20.

Figure 18A:
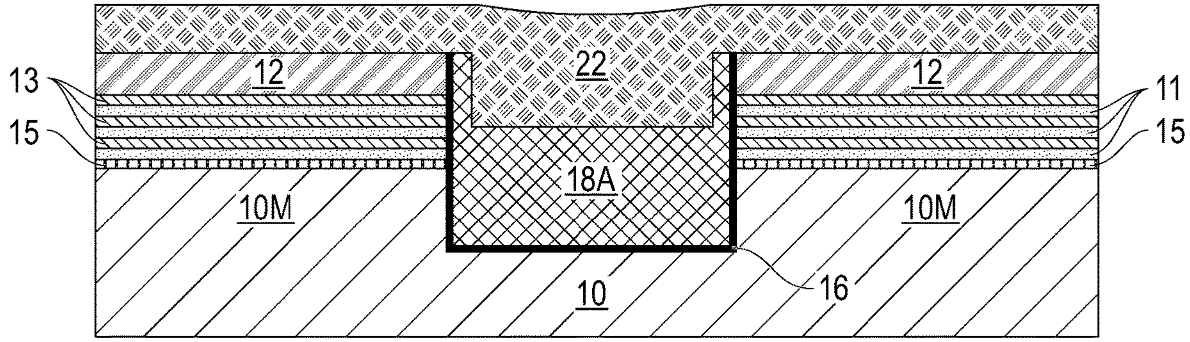
FIGS. 18A and 18B are cross sectional views of the exemplary semiconductor structure shown in FIGS. 17A and 17B, respectively, after forming a masking layer.
Figure 18B:
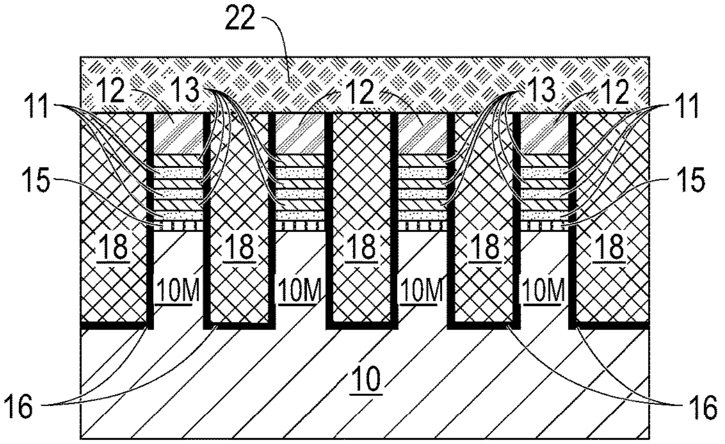

Referring now to FIGS. 18A and 18B, there are illustrated the exemplary semiconductor structure shown in FIGS. 17A and 17B, respectively, after forming a masking layer 22. The masking layer 22 of this embodiment of the present application includes a material as mentioned above for forming the same layer in FIGS. 8A-8B. The masking layer 22 of this embodiment can be formed utilizing the same technique as mentioned above in forming the same layer in FIGS. 8A-8B.

Figure 19A:
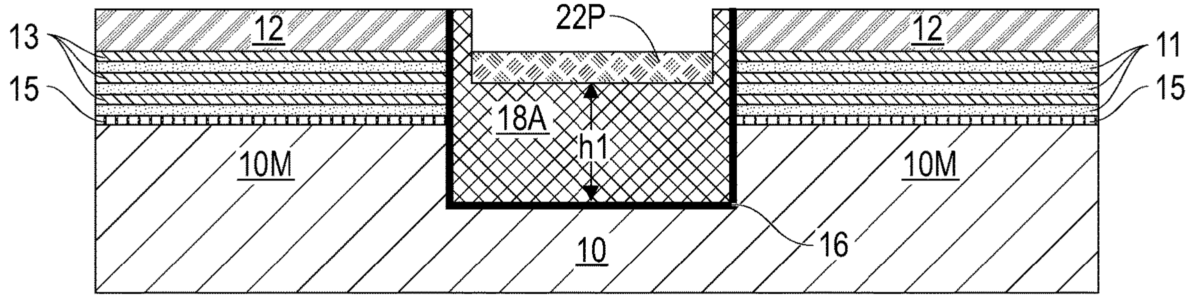
FIGS. 19A and 19B are cross sectional views of the exemplary semiconductor structure shown in FIGS. 18A and 18B, respectively, after removing the masking layer that is present on the hard mask cap, while maintaining the masking layer as a block mask on the recessed trench dielectric material that is present along the fin direction.
Figure 19B:
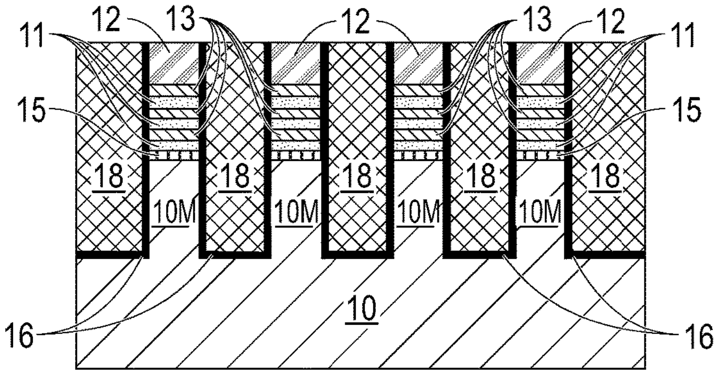

Referring now to FIGS. 19A and 19B, there are illustrated the exemplary semiconductor structure shown in FIGS. 18A and 18B, respectively, after removing the masking layer 22 that is present on the hard mask cap 12, while maintaining the masking layer 22 as a block mask 22P on the recessed trench dielectric material that is present along the fin direction. Note that in this embodiment, the masking layer 22 that is present on top of each fang of the first trench dielectric material 18A. This removal step includes a recess etch that is selective in removing the masking layer 22 from atop the hard mask caps 12 and each of the first trench dielectric material fangs. The recess etch does not remove the entirety of the masking layer 22 from within the trench 14. Instead, a portion of the masking layer 22 remains in the trench 14 and this remaining portion, i.e., block mask 22P, protects the first dielectric material 18A having the first height, h1, from a subsequently performed recessing of the trench dielectric material 18 along the gate direction.

Figure 20A:
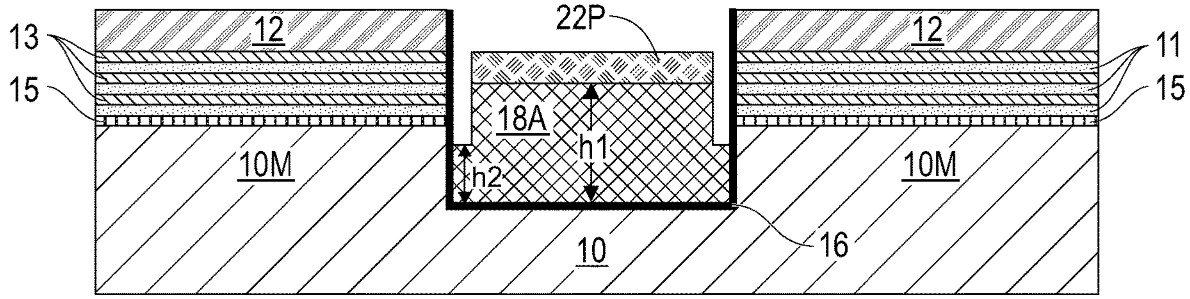
FIGS. 20A and 20B are cross sectional views of the exemplary semiconductor structure shown in FIGS. 19A and 19B, respectively, after recessing the physically exposed trench dielectric material that is present along the gate direction.
Figure 20B:
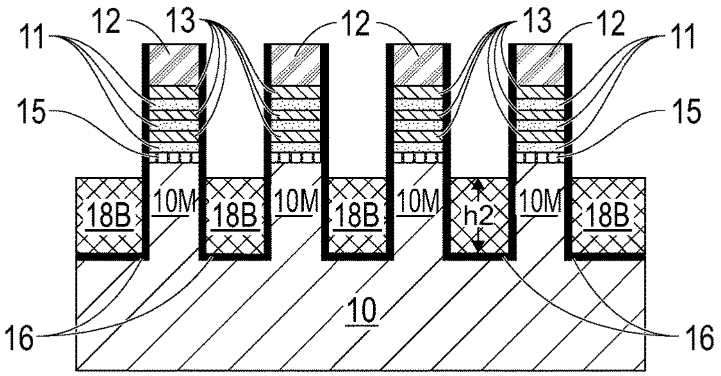

Referring now to FIGS. 20A and 20B, there are illustrated the exemplary semiconductor structure shown in FIGS. 19A and 19B, respectively, after recessing the physically exposed trench dielectric material 18 that is present along the gate direction. No recessing of the first trench dielectric material 18A occurs directly beneath the block mask 22P. This recessing provides a second trench dielectric material 18B along the gate direction that has a second height, h2. The second height, h2, of the second dielectric material 18B is less than the first height, h1, of the first trench dielectric material 18A. Since the first trench dielectric material fangs are not protected by the block mask 22P, this recessing step also recesses the first trench dielectric material fangs in the same amount as the recessing of the trench dielectric material along the gate direction. The first trench dielectric material 18A now has a middle portion having the first height, h1, and end portions having the second height, h2. In this embodiment, the second height, h2, is beneath a bottommost surface of the patterned semiconductor base layer 15. This recessing step includes a partial etching process that is selective in removing dielectric material that provides the trench dielectric material 18. In the present application, the first trench dielectric material 18A that is along the fin direction and in the trench 14 can be referred to as a first trench dielectric structure that separates two active device regions from each other, while the second trench dielectric material 18B that is along the gate direction can be referred to as a second trench dielectric structure that is located along the base of each semiconductor fin 10F (or unetched portion of the semiconductor substrate 10 in cases in which a nanosheet stack is formed).

Figure 21A:
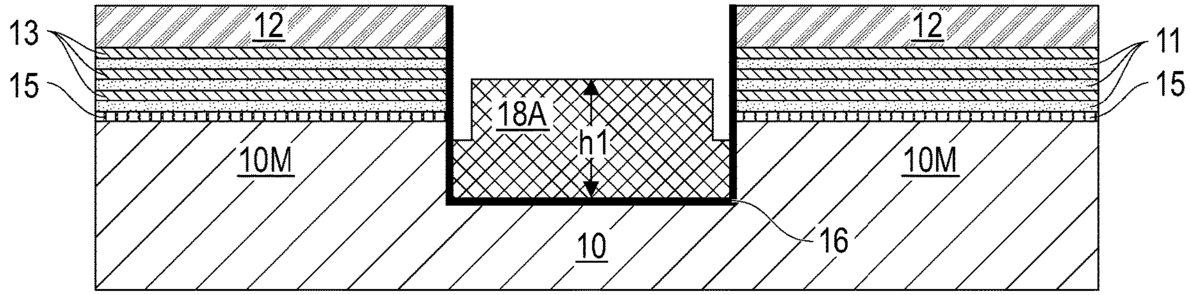
FIGS. 21A and 21B are cross sectional views of the exemplary semiconductor structure shown in FIGS. 20A and 20B, respectively, after removing the block mask that was maintained on the recessed trench dielectric material that is present along the fin direction.
Figure 21B:
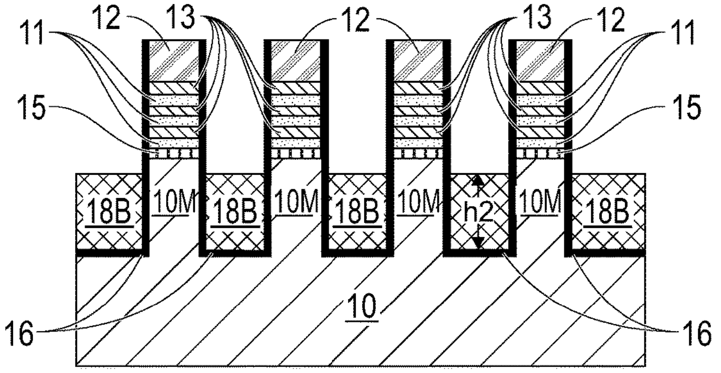

Referring now to FIGS. 21A and 21B, there are illustrated the exemplary semiconductor structure shown in FIGS. 20A and 20B, respectively, after removing the block mask 22P that was maintained on the recessed trench dielectric material (i.e., the first trench dielectric material 18A) that is present along the fin direction. The block mask 22P can be removed utilizing any material removal process that is selective in removing the material that provides the block mask 22P.

Figure 22A:
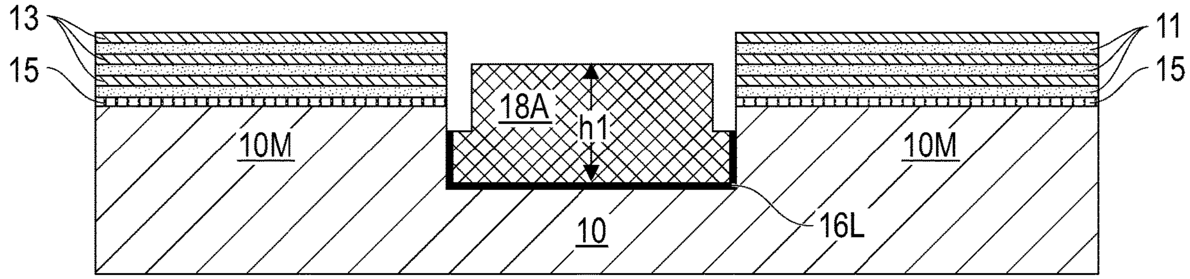
FIGS. 22A and 22B are cross sectional views of the exemplary semiconductor structure shown in FIGS. 21A and 21B, respectively, after removing each hard mask cap.
Figure 22B:
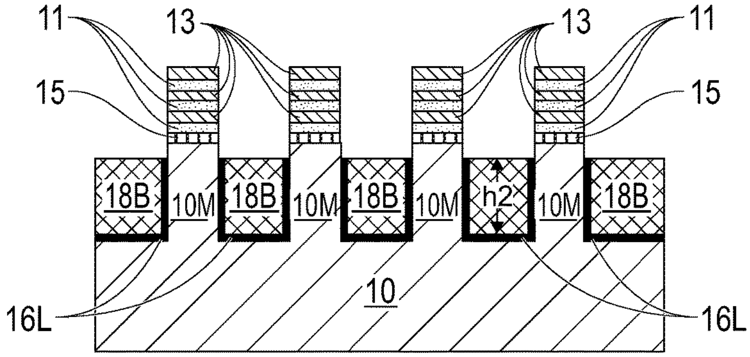

Referring now to FIGS. 22A and 22B, there are cross sectional views of the exemplary semiconductor structure shown in FIGS. 21A and 21B, respectively, after removing each hard mask cap 12. During the removal of the hard mask caps 12 an upper portion of the dielectric material layer 16 that is not covered by either the first trench dielectric material 18A and the second trench dielectric material 18B can removed. The remaining dielectric material layer 16 can be referred to herein as dielectric liner 16L. Note that an upper sidewall portion of each of the semiconductor mesa 10M together with a sidewall of each of the patterned sacrificial semiconductor base layer 15 and the nanosheet stack including alternating patterned semiconductor material layers 11 and patterned semiconductor channel material layers 11 will now be physically exposed as is shown in FIGS. 22A and 22B. The removal of each hard mask cap 12 and the partial removal of the dielectric material layer 16 includes one or more etching process. In one example and when the hard mask caps 12 and the dielectric material layer 16 are composed of a compositionally same dielectric material, a single RIE process can be used to remove each hard mask cap 12 and the partial removal of the dielectric material layer 16. In another example and when the hard mask caps 12 and the dielectric material layer 16 are composed of compositionally different dielectric materials, two separate RIE processes can be used to remove each hard mask cap 12 and the partial removal of the dielectric material layer 16.

Figure 23A:
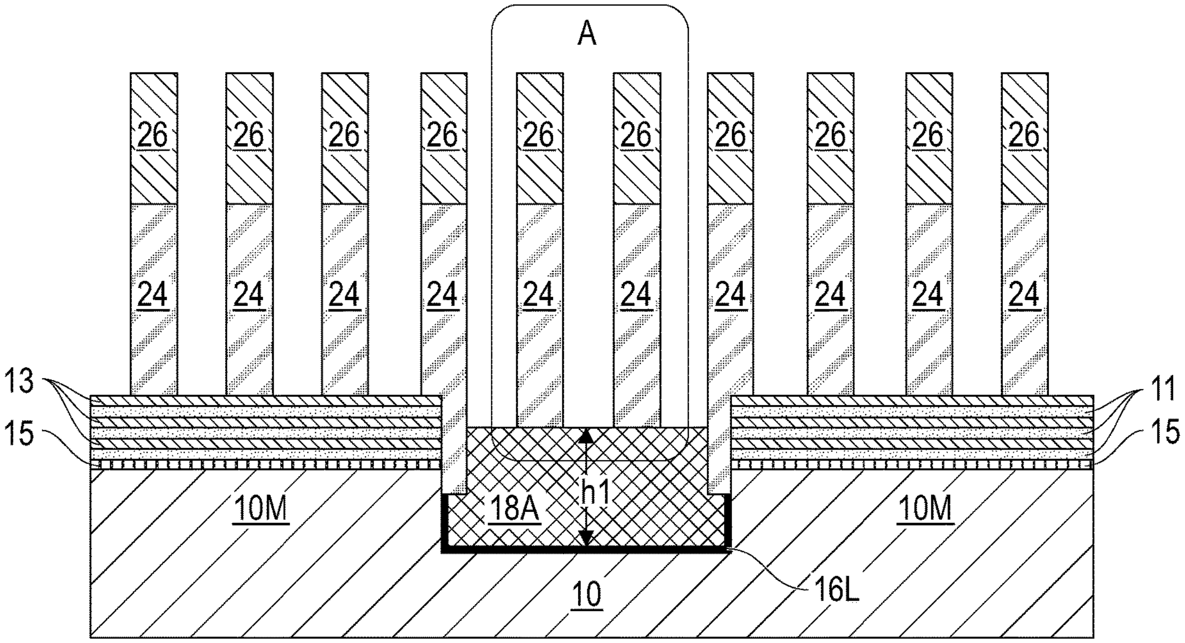
FIGS. 23A and 23B are cross sectional views of the exemplary semiconductor structure shown in FIGS. 22A and 22B, respectively, after forming sacrificial gate structures.
Figure 23B:
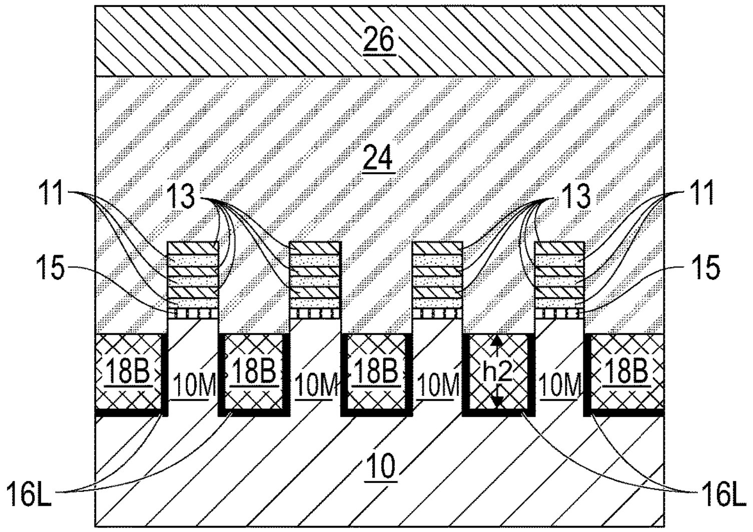
Figure 23C:
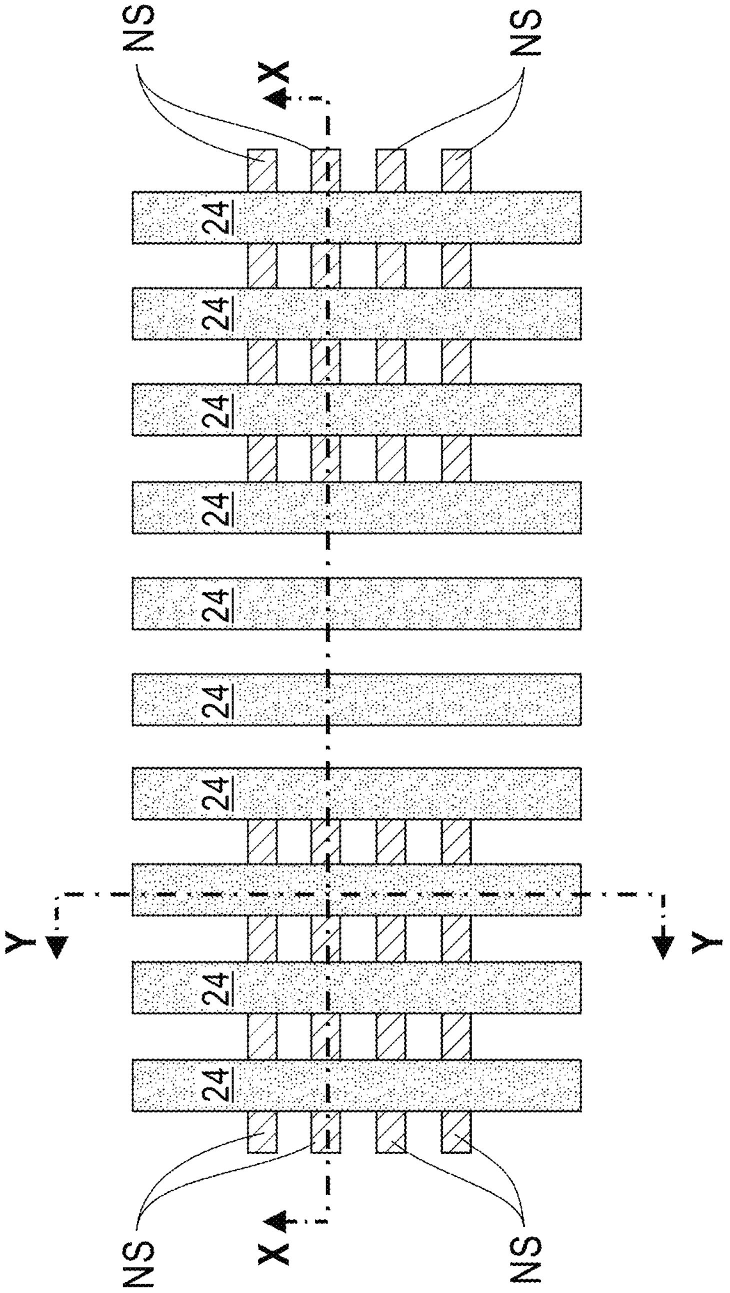
FIG. 23C is a top down view of the exemplary structure shown in FIGS. 23A-23B; some of the elements/components present in FIGS. 23A-23B are omitted from the top down view for clarity.

Referring now to FIGS. 23A and 23B are cross sectional views of the exemplary semiconductor structure shown in FIGS. 22A and 22B, respectively, after forming sacrificial gate structures 24. Optional sacrificial gate caps 26 can also be formed. FIG. 23C is a top down view of the exemplary structure shown in FIGS. 23A-23B. Some of the sacrificial gate structures 24 staddle the nanosheet stacks. Other sacrificial gate structures 24 are formed directly on the first trench dielectric material 18A and in shallow trench isolation region A. Yet other sacrificial gate structures 24 are partially formed on the nanosheet stack and partially formed on the first trench dielectric material 18A.

Each sacrificial gate structure 24 includes at least the sacrificial gate material (and optionally the sacrificial gate dielectric) as defined above in forming the same structure shown in FIGS. 13A-13C. Each sacrificial gate cap 26 includes a hard mask material mentioned above for forming such caps in the structure shown in FIGS. 13A-13C. The sacrificial gate structures 24 and sacrificial gate caps 26 can be formed utilizing the same technique mentioned above in forming each in the structure shown in FIGS. 13A-13C.

As is shown in FIG. 23A, the sacrificial gate structures 24 that are located entirely in shallow trench isolation region A and formed directly on the first trench dielectric material 18A have a smaller aspect ratio compared to the sacrificial gate structures 24 that are located in the two active device regions and which straddle the semiconductor fins 10F; all gate structures formed in the shallow trench isolation region A and on the first trench dielectric material 18A having h1 have a substantially same aspect ratio. Those sacrificial gate structures 24 that are located partially on the semiconductor fin 10F and partially on the first trench dielectric material 18A have a smaller aspect ratio compared to sacrificial gate structures 24 formed only in the active device region. In the present application, the aspect ratio is a ratio of the height to width of each gate structures. The gate structures can be the sacrificial gate structures 24 as mentioned above or functional gate structures as defined above that are subsequently formed during a replacement gate process in which the sacrificial gate structures 24 are removed and replaced with a functional gate structure. The functional gate structures that are formed entirely in the active device region are active functional gate structures, while the functional gate structures located entirely in the shallow trench isolation region are inactive functional gate structures. For the functional gate structures, the functional gate structures that are located in shallow trench isolation region A and located on the first trench dielectric material 18A have a smaller aspect ratio as compared to the functional gate structures that are located in the two active device regions and which are located on the nanosheet stacks. No gate structure flop over is observed in the shallow trench isolation region, A. Embodiments can include replacing only the sacrificial gate structures 24 in the active device regions with a functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a shallow trench isolation region comprising a first trench dielectric material having a first height and a first gate structure; and an active device region located adjacent to the shallow trench isolation region and comprising a second trench dielectric material having a second height and a second gate structure, wherein the second gate structure is located on a surface of a semiconductor channel region having a third height and a surface of the second trench dielectric material, wherein the second height is less than the first height, and the first height and the second height are both less than the third height.

2. The semiconductor structure of claim 1, wherein the first gate structure has a smaller aspect ratio as compared to the second gate structure.

3. The semiconductor structure of claim 1, wherein the first gate structure is located entirely on the first trench dielectric material.

4. The semiconductor structure of claim 3, wherein the semiconductor channel region comprises a semiconductor fin, and the first height of the first trench dielectric material is located between a topmost surface and a bottommost surface of the semiconductor fin.

5. The semiconductor structure of claim 4, wherein the second height of the second trench dielectric material is located between the topmost surface and the bottommost surface of the semiconductor fin.

6. The semiconductor structure of claim 3, wherein the semiconductor channel region comprises a nanosheet stack, and the first height of the first trench dielectric material is located between a topmost surface and a bottommost surface of the nanosheet stack.

7. The semiconductor structure of claim 6, wherein the second height of the second trench dielectric material is located beneath the bottommost surface of the nanosheet stack.

8. The semiconductor structure of claim 3, wherein the first trench dielectric material has a middle portion having the first height and an end portion flanking each side of the middle portion having the second height.

9. The semiconductor structure of claim 8, wherein the semiconductor channel region comprises a nanosheet stack, and the first height of the first trench dielectric material is located between a topmost surface and a bottommost surface of the nanosheet stack.

10. The semiconductor structure of claim 9, wherein the second height of both the first trench dielectric material and the second trench dielectric material is located beneath the bottommost surface of the nanosheet stack.

11. The semiconductor structure of claim 10, wherein the nanosheet stack is located directly on a mesa portion of a semiconductor substrate.

12. The semiconductor structure of claim 9, further comprising a sacrificial semiconductor base layer located beneath the nanosheet stack.

13. The semiconductor structure of claim 12, wherein the second height of both the first trench dielectric material and the second trench dielectric material is located beneath a bottommost surface of the sacrificial semiconductor base layer.

14. The semiconductor structure of claim 13, wherein the sacrificial semiconductor base layer is located directly on a mesa portion of a semiconductor substrate.

15. The semiconductor structure of claim 2, wherein the first gate structure and the second gate structure are both sacrificial gate structures.

16. The semiconductor structure of claim 2, wherein the first gate structure is an inactive functional gate structure and the second gate structure is a functional gate structure.

17. The semiconductor structure of claim 1, wherein the first trench dielectric material and the second trench dielectric material are composed of a compositionally same trench dielectric material.

18. The semiconductor structure of claim 1, further comprising a dielectric liner located along sidewalls of the first trench dielectric material and along sidewalls of the second trench dielectric material.

19. The semiconductor structure of claim 1, wherein the first trench dielectric material is embedded in a semiconductor substrate.

* * * * *